(12) United States Patent
Sakaida et al.

(10) Patent No.: US 9,910,354 B2
(45) Date of Patent: Mar. 6, 2018

(54) RESIST UNDERLAYER FILM-FORMING COMPOSITION AND METHOD FOR FORMING RESIST PATTERN USING THE SAME

(71) Applicant: NISSAN CHEMICAL INDUSTRIES, LTD., Tokyo (JP)

(72) Inventors: Yasushi Sakaida, Toyama (JP); Tokio Nishita, Toyama (JP); Noriaki Fujitani, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/305,793

(22) PCT Filed: Apr. 14, 2015

(86) PCT No.: PCT/JP2015/061467
§ 371 (c)(1),
(2) Date: Oct. 21, 2016

(87) PCT Pub. No.: WO2015/163195
PCT Pub. Date: Oct. 29, 2015

(65) Prior Publication Data
US 2017/0045820 A1    Feb. 16, 2017

(30) Foreign Application Priority Data

Apr. 25, 2014    (JP) .................................. 2014-091782

(51) Int. Cl.
| | |
|---|---|
| G03F 7/11 | (2006.01) |
| G03F 7/20 | (2006.01) |
| G03F 7/26 | (2006.01) |
| C09D 179/08 | (2006.01) |
| G03F 7/004 | (2006.01) |
| G03F 7/16 | (2006.01) |
| H01L 21/308 | (2006.01) |

(52) U.S. Cl.
CPC .............. *G03F 7/11* (2013.01); *C09D 179/08* (2013.01); *G03F 7/0045* (2013.01); *G03F 7/162* (2013.01); *G03F 7/168* (2013.01); *G03F 7/2004* (2013.01); *G03F 7/2006* (2013.01); *G03F 7/2037* (2013.01); *G03F 7/26* (2013.01); *H01L 21/3081* (2013.01); *H01L 21/3086* (2013.01)

(58) Field of Classification Search
CPC ........ G03F 7/11; G03F 7/2037; G03F 7/0045; G03F 7/2004; G03F 7/2006; G03F 7/162; G03F 7/168; G03F 7/26; G03F 7/091; G03F 7/094; C09D 179/08; H01L 21/3081; H01L 21/3086
See application file for complete search history.

(56) References Cited

U.S. PATENT DOCUMENTS

2005/0008964 A1* 1/2005 Takei .................. C08G 59/1455
430/270.1

FOREIGN PATENT DOCUMENTS

| GB | 2163759 A | * | 3/1986 |
|---|---|---|---|
| JP | 06-041295 A | * | 2/1994 |
| JP | 2004-250377 A | | 9/2004 |
| JP | 2008-015223 A | | 1/2008 |
| JP | 2010-134437 A | | 6/2010 |
| WO | 1996/033233 A1 | | 10/1996 |
| WO | 2005/098542 A1 | | 10/2005 |
| WO | 2006/040921 A1 | | 4/2006 |
| WO | 2006/040922 A1 | | 4/2006 |
| WO | 2006/049045 A1 | | 5/2006 |
| WO | 2009/096340 A1 | | 8/2009 |
| WO | 2009/104685 A1 | | 8/2009 |
| WO | 2010/061774 A1 | | 6/2010 |

OTHER PUBLICATIONS

Jun. 23, 2015 Written Opinion issued in Patent Application PCT/JP2015/061467.

(Continued)

*Primary Examiner* — Cynthia Hamilton
(74) *Attorney, Agent, or Firm* — Oliff PLC

(57) ABSTRACT

A composition for forming a resist underlayer film which make possible to form a desired high-adhesion resist pattern. A resist underlayer film-forming composition for lithography containing a polymer having the following structure Formula (1) or (2) at a terminal of a polymer chain, crosslinker, compound promoting crosslinking reaction, and organic solvent.

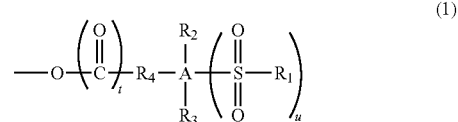

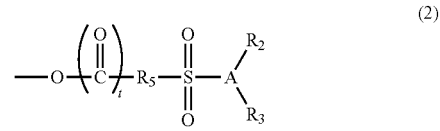

(wherein $R_1$ is a $C_{1-6}$ alkyl group optionally having a substituent, phenyl group, pyridyl group, halogeno group, or hydroxy group, $R_2$ is a hydrogen atom, a $C_{1-6}$ alkyl group, hydroxy group, halogeno group, or ester group of —C(=O)O—X wherein X is a $C_{1-6}$ alkyl group optionally having a substituent, $R_3$ is a hydrogen atom, a $C_{1-6}$ alkyl group, hydroxy group, or halogeno group, $R_4$ is a direct bond or divalent $C_{1-8}$ organic group, $R_5$ is a divalent $C_{1-8}$ organic group, A is an aromatic ring or heteroaromatic ring, t is 0 or 1, and u is 1 or 2.)

9 Claims, 1 Drawing Sheet

(56) References Cited

FOREIGN PATENT DOCUMENTS

| WO | 2012/124597 A1 | 9/2012 |
| WO | 2012/157607 A1 | 11/2012 |
| WO | 2013/133088 A1 | 9/2013 |
| WO | 2013/141015 A1 | 9/2013 |
| WO | 2013/168610 A1 | 11/2013 |

OTHER PUBLICATIONS

Jun. 23, 2015 International Search Report issued in Patent Application PCT/JP2015/061467.

* cited by examiner

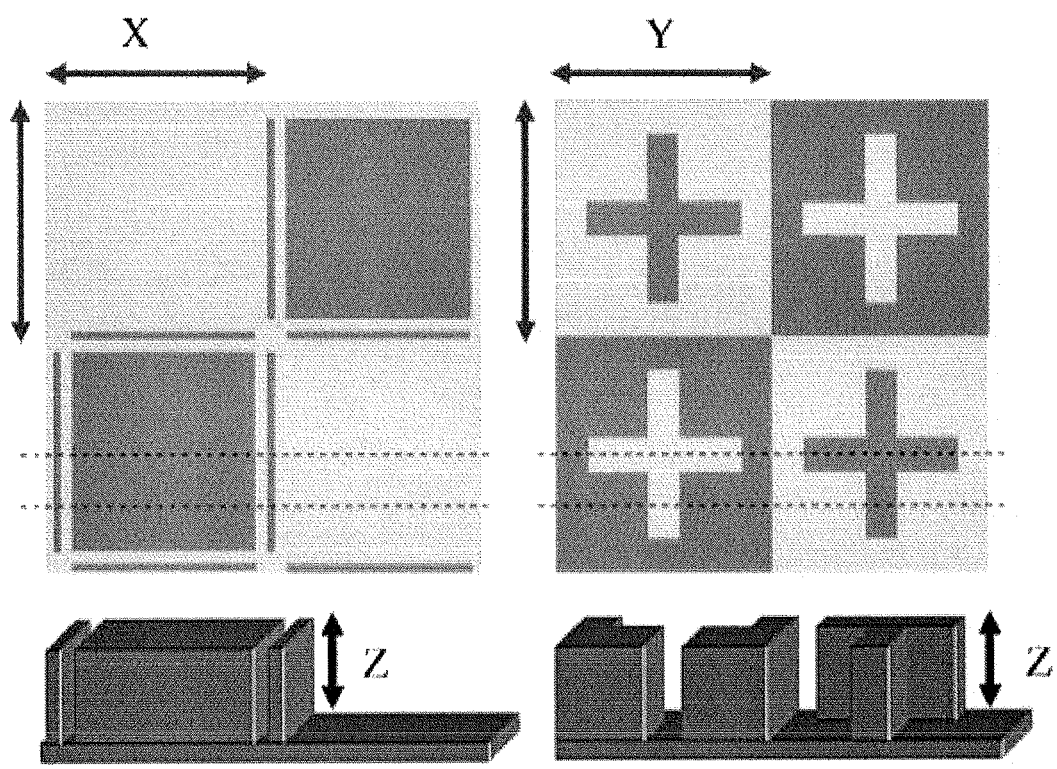
X=13 μm, Y=14 μm, Z=230nm

RESIST UNDERLAYER FILM-FORMING COMPOSITION AND METHOD FOR FORMING RESIST PATTERN USING THE SAME

TECHNICAL FIELD

The present invention relates to a resist underlayer film-forming composition for lithography that has excellent solubility of solid content in an organic solvent and good application property to a substrate for improving variation of line width of a resist pattern to be formed and adhesion of the resist pattern, and a method for forming a resist pattern using the resist underlayer film-forming composition.

BACKGROUND ART

Conventionally, in production of a semiconductor device, microprocessing by lithography using a resist composition has been carried out. The microprocessing is a processing method in which a thin film of a photoresist composition is formed on a semiconductor substrate such as a silicon wafer, irradiated with an active light such as an ultraviolet light through a mask pattern that has a pattern of a device, and developed, and the substrate is etched using the obtained photoresist pattern as a protective film to form fine irregularities corresponding to the pattern on a surface of the substrate. In recent years, an increase in degree of integration of the semiconductor device has advanced, and the wavelength of used active light shortens from an i line (wavelength: 365 nm) and a KrF excimer laser (wavelength: 248 nm) to an ArF excimer laser (wavelength: 193 nm). For this reason, diffuse reflection of active light on the semiconductor substrate and influences of standing wave are severe problems. In order to solve the problems, a method for providing an anti-reflective coating (Bottom Anti-Reflective Coating: BARC) between the resist and the semiconductor substrate has been widely investigated. The anti-reflective coating is also referred to as resist underlayer film. As the anti-reflective coating, an organic anti-reflective coating formed from a polymer having a light absorbing moiety and the like has been often investigated from the viewpoint of ease of use thereof.

Patent Documents 1 to 3 disclose a resist underlayer film (anti-reflective coating) in which no intermixing with a photoresist film formed thereon is caused, a desired optical parameter (k value and n value) is obtained during exposure using an ArF excimer laser, and a desired dry etching rate is obtained.

On the other hand, in lithography using EUV (abbreviation of extreme ultraviolet light, wavelength: 13.5 nm) exposure that is a further microprocessing technology, reflection on a substrate does not occur, but roughness of side wall of a resist pattern due to miniaturization of a pattern becomes a problem. Therefore, a resist underlayer film for forming a resist pattern profile having high rectangularity has been often investigated. As a material for forming a resist underlayer film for exposure to a high-energy beam such as EUV, an X ray, and an electron beam, a resist underlayer film-forming composition in which generation of outgas is reduced has been disclosed. (see Patent Document 4).

PRIOR ART DOCUMENTS

Patent Documents

Patent Document 1: International publication WO 2005/098542

Patent Document 2: International publication WO 2009/096340

Patent Document 3: International publication WO 2009/104685

Patent Document 4: International publication WO 2010/061774

SUMMARY OF THE INVENTION

Problem to be Solved by the Invention

Properties required for a resist underlayer film include, for example, no intermixing with a resist film to be formed thereon (insolubility in a resist solvent) and a higher dry etching rate than that of the resist film.

In a case of lithography by EUV exposure, the line width of a resist pattern to be formed is 32 nm or less, and a resist underlayer film for EUV exposure having a thinner thickness than that of conventional one is used. When such a thinner film is formed, pinholes, aggregation, and the like are likely to occur by influences of a substrate surface, a polymer to be used, and the like. It is difficult to form a homogeneous film having no defect.

In formation of the resist pattern, a process for removing an unexposed area of the resist film by a solvent capable of dissolving the resist film, generally an organic solvent, and leaving the exposed area of the resist film as the resist pattern may be adopted at a development step. In such a process of negative development, an improvement in adhesion of the resist pattern becomes a major challenge.

An object of the present invention is to obtain a composition for forming a resist underlayer film that is capable of forming a desired resist pattern by solving the problem.

Means for Solving the Problems

The inventors of the present invention have been found that when a resist underlayer film-forming composition containing a polymer in which a sulfonyl group is introduced into a terminal portion is used in a lithography process, the problem can be solved. A first aspect of the present invention relates to a resist underlayer film-forming composition for lithography containing a polymer having a structure of Formula (1) or (2) below at a terminal of a polymer chain, a crosslinker, a compound promoting a crosslinking reaction, and an organic solvent.

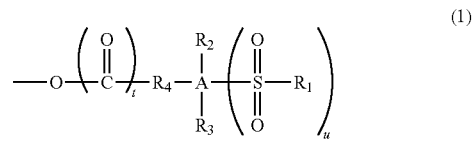

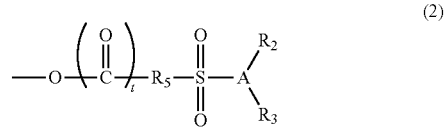

(wherein $R_1$ is a $C_{1-6}$ alkyl group optionally having a substituent, a phenyl group, a pyridyl group, a halogeno group, or a hydroxy group, $R_2$ is a hydrogen atom, a $C_{1-6}$ alkyl group, a hydroxy group, a halogeno group, or an ester group of —C(=O)O—X wherein X is a $C_{1-6}$ alkyl group optionally having a substituent, $R_3$ is a hydrogen atom, a $C_{1-6}$ alkyl group, a hydroxy group, or a halogeno group, $R_4$ is a direct bond or a divalent $C_{1-8}$ organic group, $R_5$ is a divalent $C_{1-8}$ organic group, A is an aromatic ring or a heteroaromatic ring, t is 0 or 1, and u is 1 or 2.

When X is an alkyl group having a substituent, examples of the substituent include $C_{1-3}$ alkoxy groups such as methoxy group, ethoxy group, and propoxy group. The divalent organic group may have one or more atoms selected from a nitrogen atom, an oxygen atom, and a sulfur atom. Examples of the halogeno group and a halogeno group described later herein include fluoro group, chloro group, bromo group, and iodo group.

A second aspect of the present invention relates to a method for forming a resist pattern comprising the steps of: applying the resist underlayer film-forming composition for lithography of the present invention to a semiconductor substrate, followed by baking, to form a resist underlayer film; forming a resist film on the resist underlayer film using a resist solution; exposing the semiconductor substrate coated with the resist underlayer film and the resist film to radiation selected from the group consisting of a KrF excimer laser, an ArF excimer laser, an extreme ultraviolet light (EUV), and an electron beam; and developing the exposed substrate.

Effects of the Invention

The resist underlayer film-forming composition for lithography of the present invention is a composition containing a polymer, a crosslinker, a compound promoting a crosslinking reaction, and an organic solvent, wherein a terminal of the polymer contained in the resist underlayer film-forming composition is capped by a structure of Formula (1) or (2). With such a configuration, an improvement in adhesion of a resist pattern in a process of negative development, which has been a challenge, can be achieved, and roughness of the resist pattern can be further improved.

BRIEF DESCRIPTION OF THE DRAWINGS

FIG. 1 shows a top surface and a cross section of a substrate having a pattern, which is used in an application property test.

MODES FOR CARRYING OUT THE INVENTION

[Polymer]

A polymer contained in the resist underlayer film-forming composition for lithography of the present invention has the structure of Formula (1) or (2) at a terminal of a polymer chain.

The polymer is a reaction product of raw material monomers containing a compound of the following Formula (1a), a compound of the following Formula (2a), or both a compound of the following Formula (1b) and a compound of the following Formula (3).

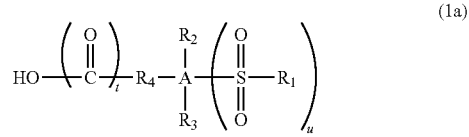
(1a)

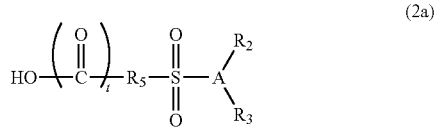
(2a)

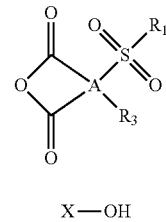
(1b)

$$X-OH \quad (3)$$

(wherein $R_1$, $R_2$, $R_3$, $R_4$, $R_5$, X, A, t, and u have the same definitions as those of $R_1$, $R_2$, $R_3$, $R_4$, $R_5$, X, A, t, and u in the structure of Formula (1) or (2).)

Examples of the $C_{1-6}$ alkyl group described above and described later herein include methyl group, ethyl group, propyl group, isopropyl group, butyl group, sec-butyl group, tert-butyl group, pentyl group, and hexyl group. Examples of the aromatic ring described above and described later herein include benzene, naphthalene, and anthracene. Examples of the heteroaromatic ring include triazine, pyrimidine, imidazole, and pyridine.

For example, the polymer has a structural unit of the following Formula (4) and a structural unit of the following Formula (5).

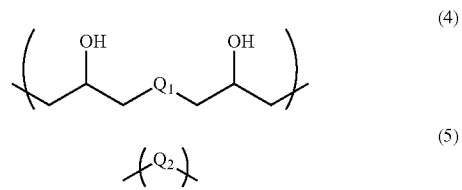

(wherein $Q_1$ and $Q_2$ are each independently a divalent organic group having a $C_{1-13}$ hydrocarbon group and optionally having a substituent, a divalent organic group having an aromatic ring, or a divalent organic group having a heterocycle containing 1 to 3 nitrogen atoms.)

The $C_{1-13}$ hydrocarbon group is, for example, a linear or branched alkyl group having a carbon atom number of 1 to 13, and examples thereof include tert-butyl group, methyl group, ethyl group, propyl group, isopropyl group, butyl group, sec-butyl group, pentyl group, hexyl group, octyl group, nonyl group, decyl group, undecyl group, and dodecyl group.

When the hydrocarbon group has a substituent, examples of the substituent include halogeno group. The hydrocarbon group is a linear or branched hydrocarbon group, an alicyclic hydrocarbon group, or a combination of a linear or branched hydrocarbon group and an alicyclic hydrocarbon group. Examples of the alicyclic hydrocarbon group include cyclobutylene group, cyclopentylene group, and cyclohexylene group.

Examples of the heterocycle containing 1 to 3 nitrogen atoms include triazinetrione, pyrimidinetrione, imidazolidinedione, imidazolidone, and pyridone.

The structural unit of Formula (4) is, for example, a structural unit of the following Formula (4a), (4b), or (4c).

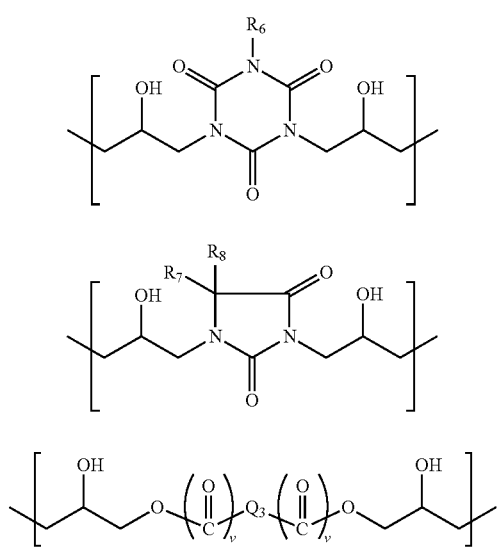

(wherein $R_6$ is a hydrogen atom, or a $C_{1-6}$ alkyl group or allyl group, $R_7$ and $R_8$ are each independently a hydrogen atom or a $C_{1-6}$ alkyl group, $Q_3$ is a $C_{1-13}$ hydrocarbon group optionally having a substituent, or an aromatic ring optionally having a substituent, and two vs are each independently 0 or 1.)

When the hydrocarbon group has a substituent, examples of the substituent include halogeno group. The hydrocarbon group is a linear or branched hydrocarbon group, an alicyclic hydrocarbon group, or a combination of a linear or branched hydrocarbon group and an alicyclic hydrocarbon group. When the aromatic ring has a substituent, examples of the substituent include a $C_{1-6}$ alkyl group.

For example, $Q_3$ is a group of the following Formula.

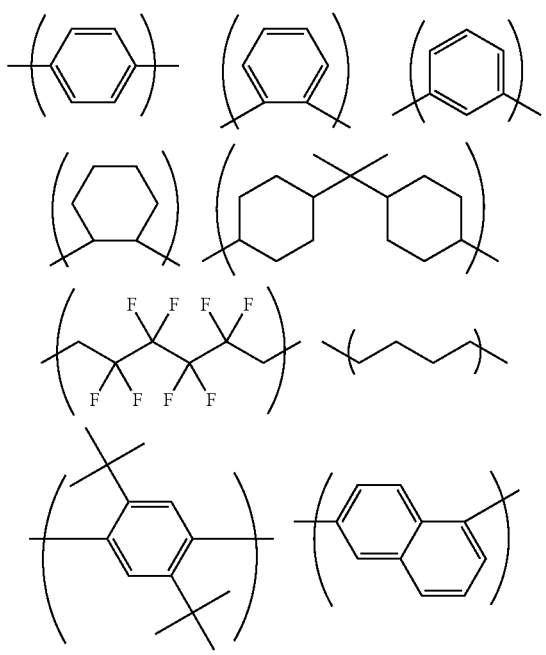

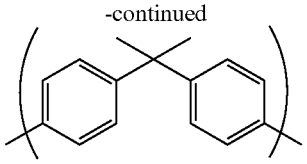

The structural unit of Formula (5) is, for example, a structural unit of the following Formula (5a), (5b), (5c), or (5d).

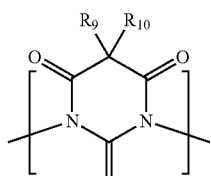

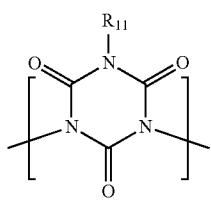

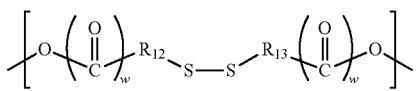

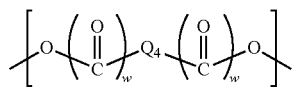

(wherein $R_9$ and $R_{10}$ are each independently a hydrogen atom, a $C_{1-6}$ alkyl group, or an aromatic ring, $R_{11}$ is a $C_{1-6}$ alkyl group or allyl group, $R_{12}$ and $R_{13}$ are each independently a $C_{1-3}$ alkylene group, for example, a methylene group, an ethylene group, or a propylene group, $Q_4$ is a $C_{1-13}$ hydrocarbon group optionally having a substituent, or an aromatic ring optionally having a substituent, and two ws are each independently 0 or 1.)

When the hydrocarbon group has a substituent, examples of the substituent include hydroxy group and halogeno group. The hydrocarbon group is a linear or branched hydrocarbon group, an alicyclic hydrocarbon group, or a combination of a linear or branched hydrocarbon group and an alicyclic hydrocarbon group. The linear or branched hydrocarbon group may have a double bond between two carbon atoms. When the aromatic ring has a substituent, examples of the substituent include a $C_{1-6}$ alkyl group and hydroxy group. For example, $Q_4$ is a group of the following Formula.

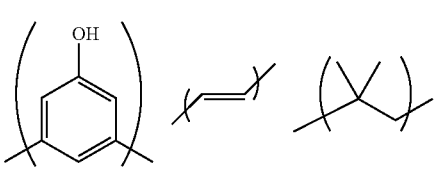

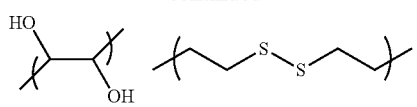
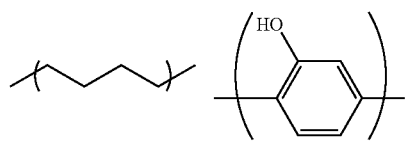
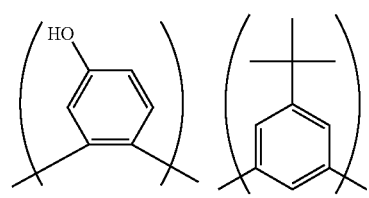
Examples of the compound of Formula (1a) include compounds of the following Formulae (1a-1) to (1a-89).
(1a-1)
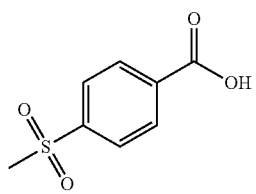
(1a-2)
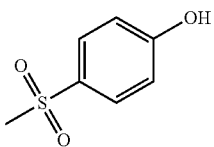
(1a-3)
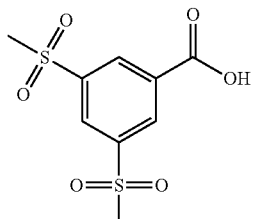
(1a-4)
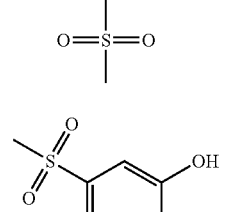
(1a-5)
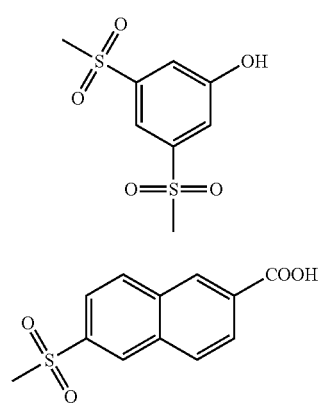
(1a-6)
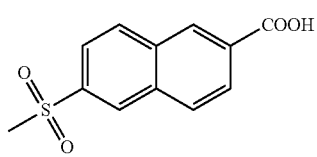
(1a-7)
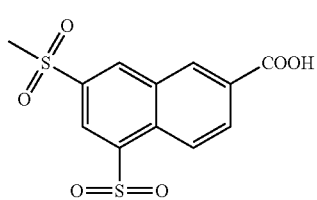
(1a-8)
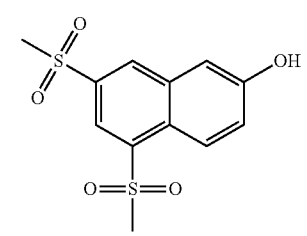
(1a-9)
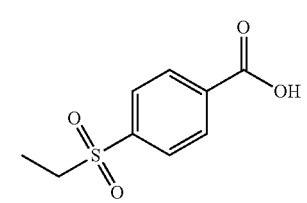
(1a-10)
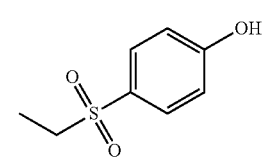
(1a-11)
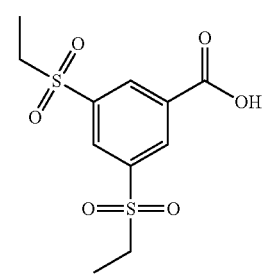
(1a-12)
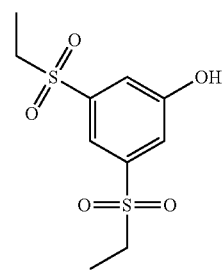

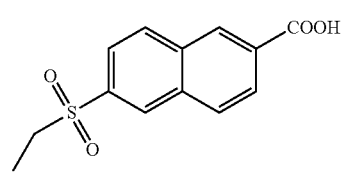
(1a-13)
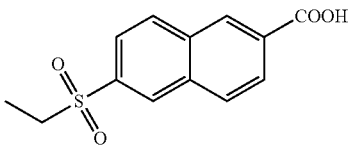
(1a-14)
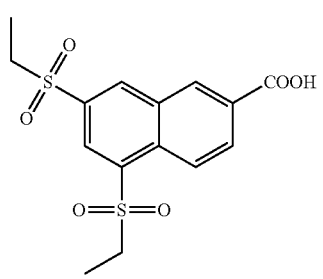
(1a-15)
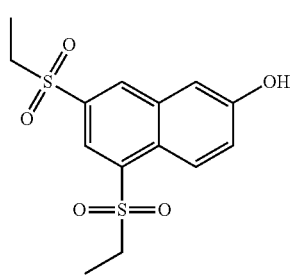
(1a-16)
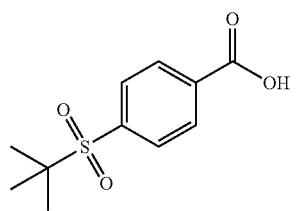
(1a-17)
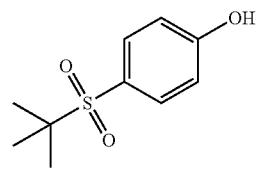
(1a-18)
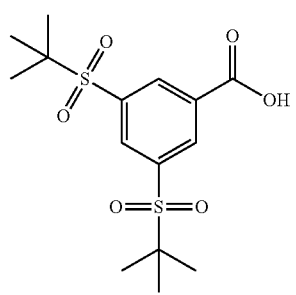
(1a-19)
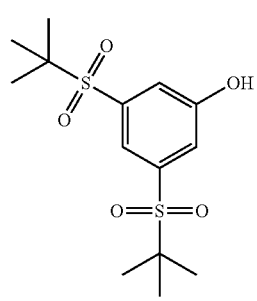
(1a-20)
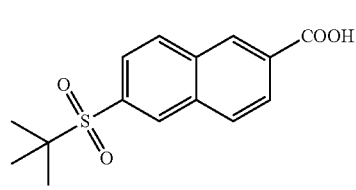
(1a-21)
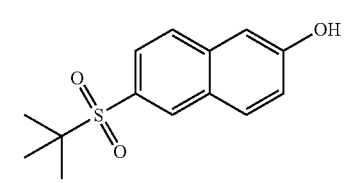
(1a-22)
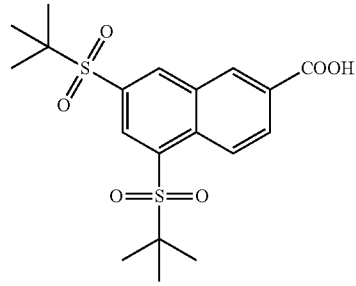
(1a-23)
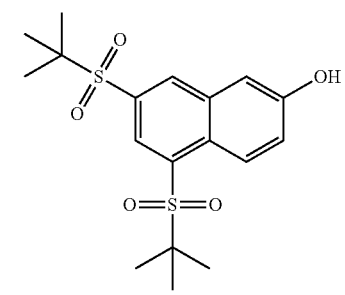
(1a-24)
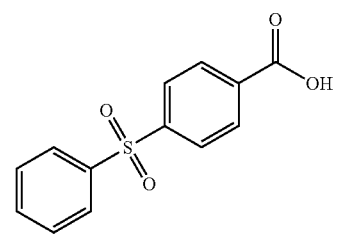
(1a-25)

(1a-26)
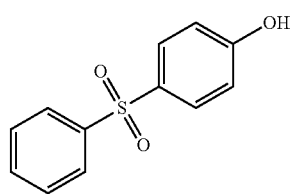
(1a-27)
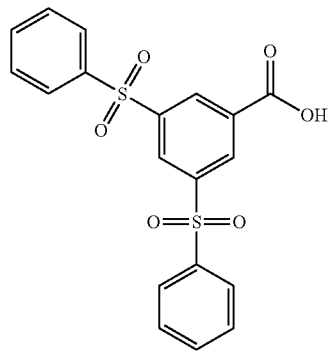
(1a-28)
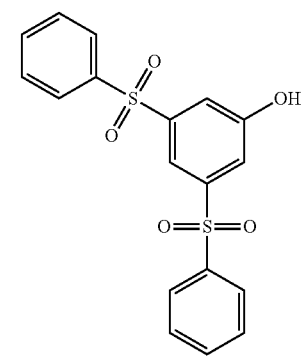
(1a-29)
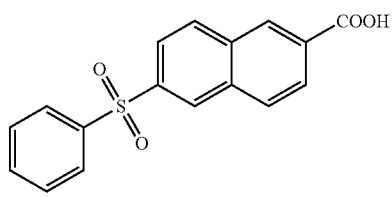
(1a-30)
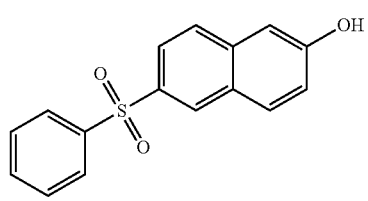
(1a-31)
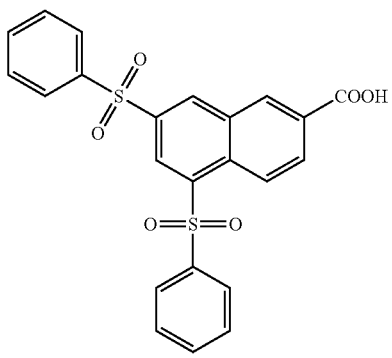
(1a-32)
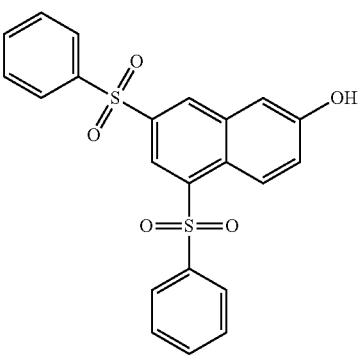
(1a-33)
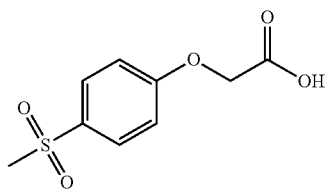
(1a-34)
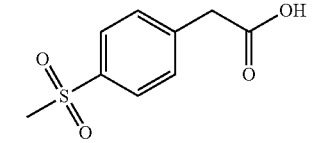
(1a-35)
(1a-36)
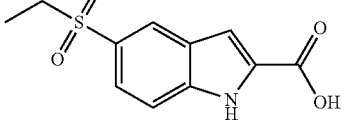
(1a-37)
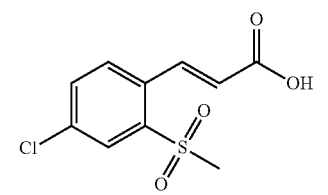

-continued
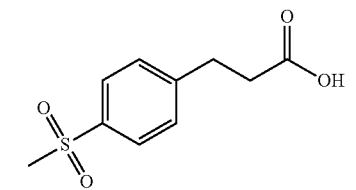
(1a-38)
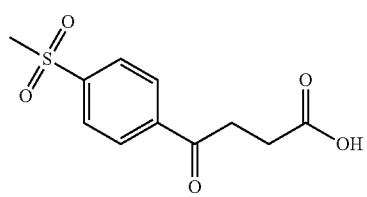
(1a-39)
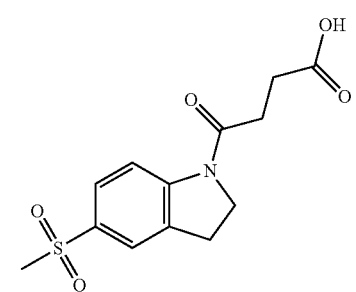
(1a-40)
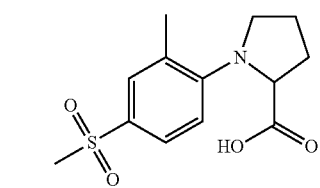
(1a-41)
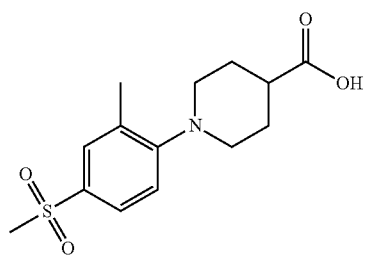
(1a-42)
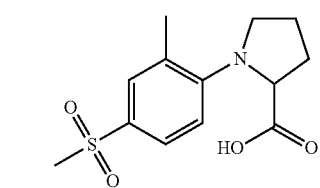
(1a-43)
-continued
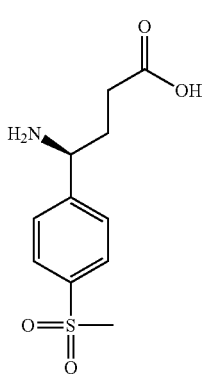
(1a-44)
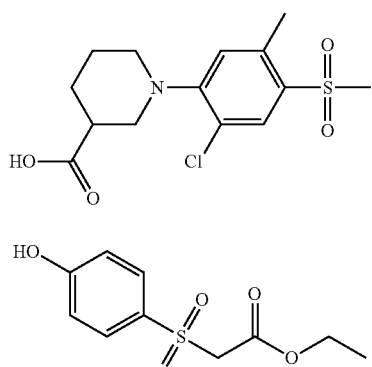
(1a-45)
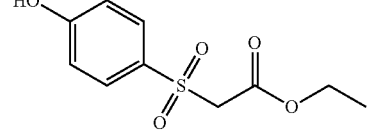
(1a-46)
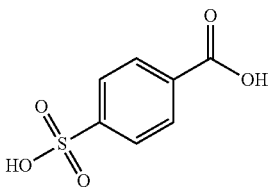
(1a-47)
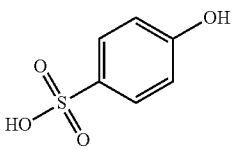
(1a-48)
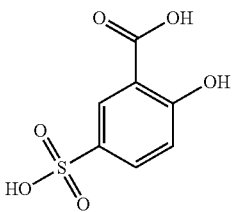
(1a-49)
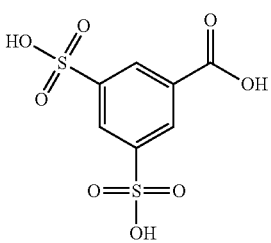
(1a-50)

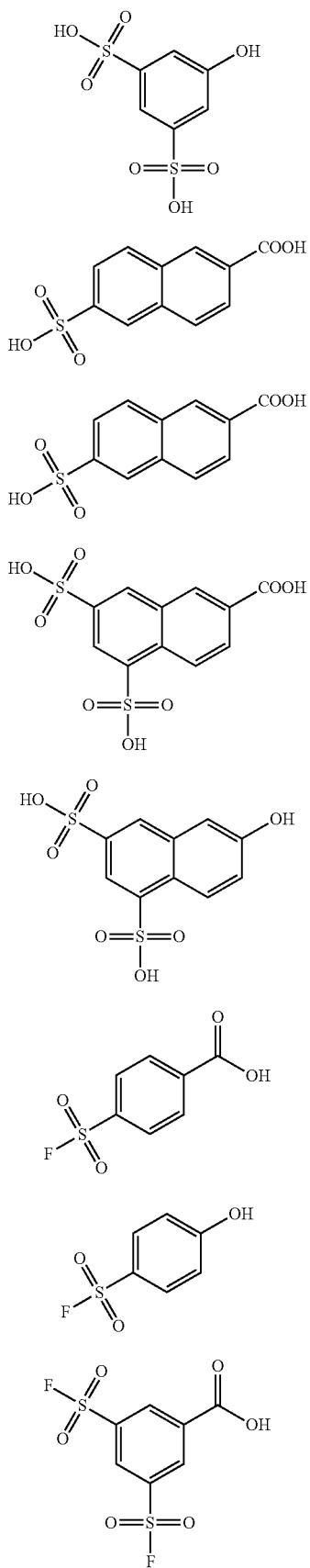
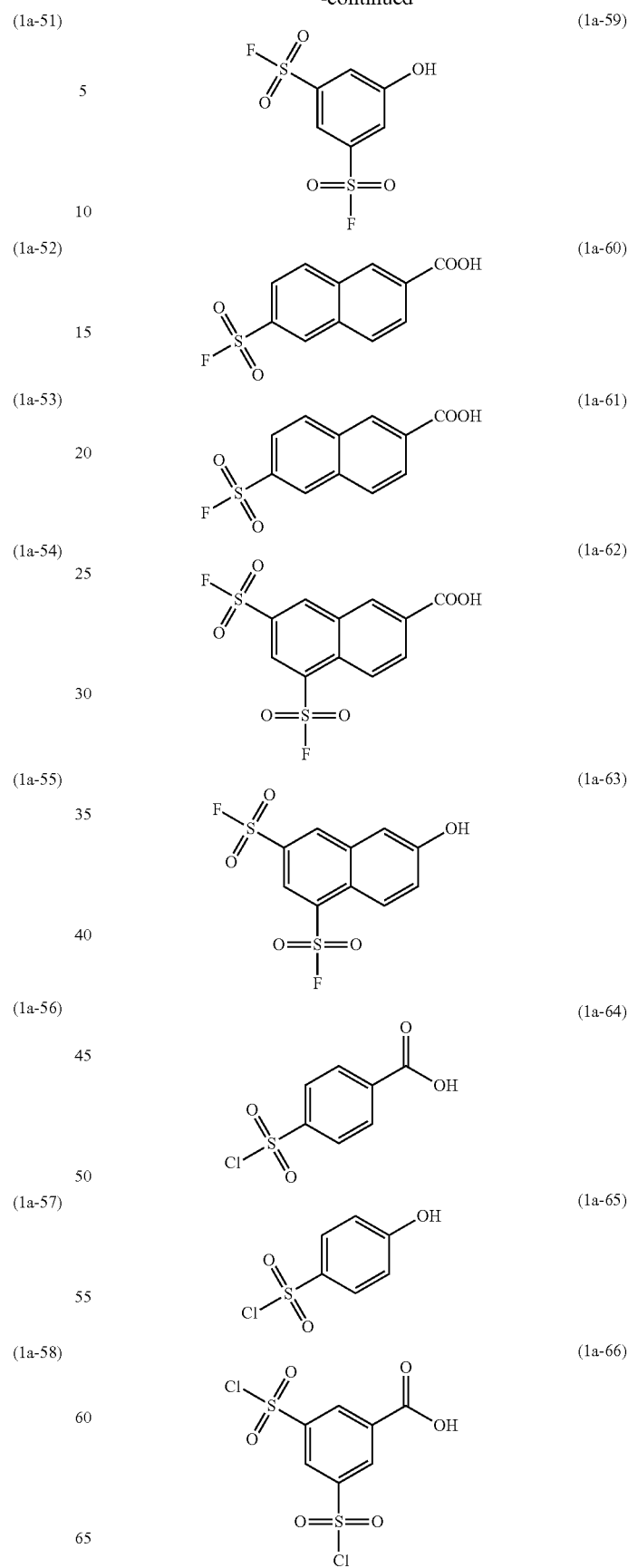

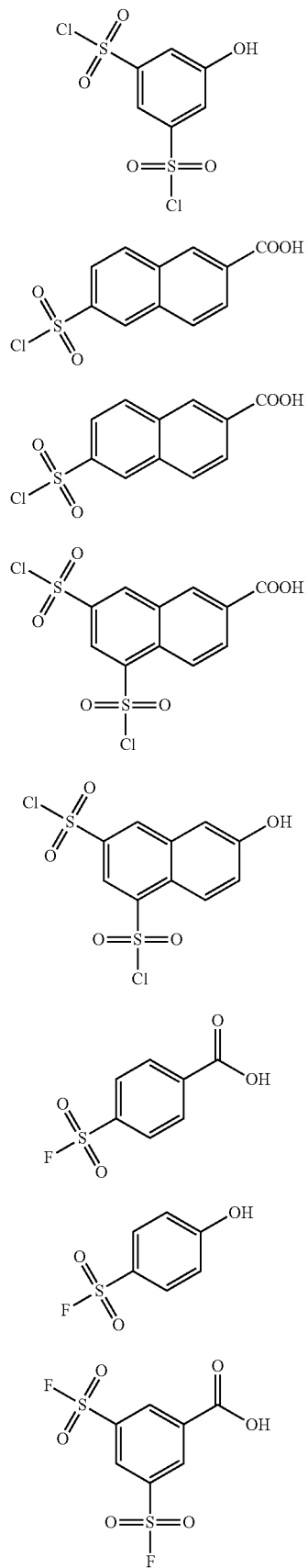
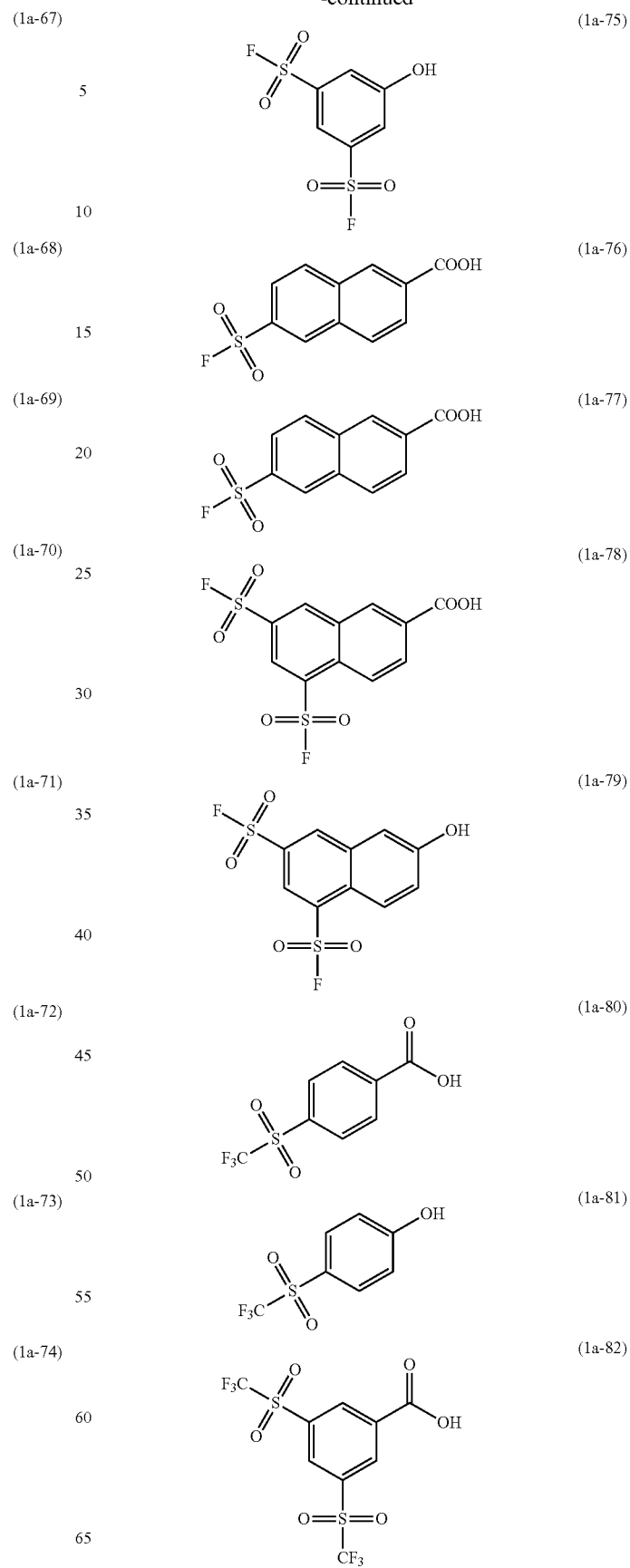

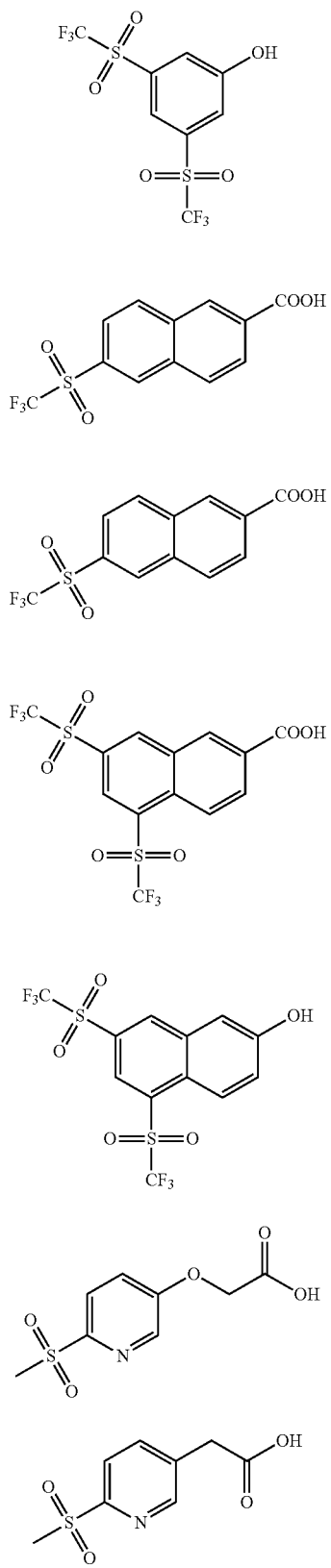
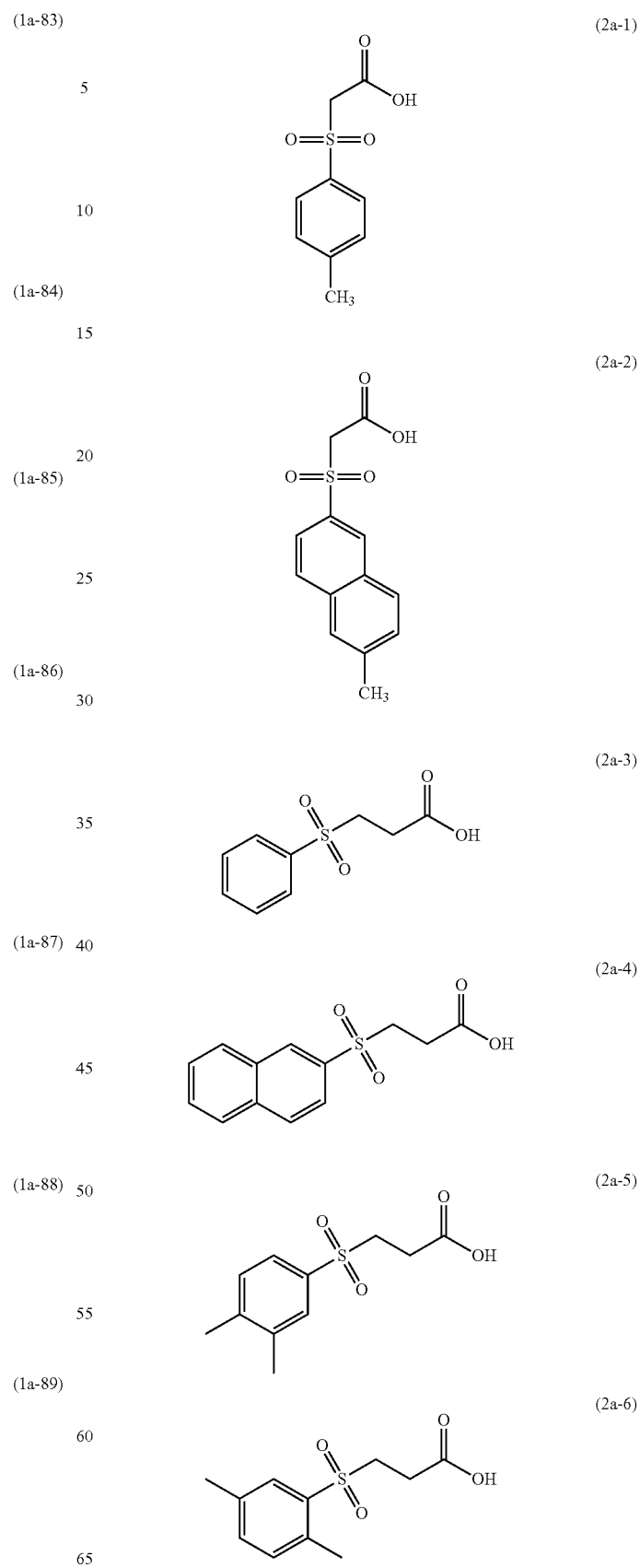
Examples of the compound of Formula (2a) include compounds of the following Formulae (2a-1) to (2a-18).

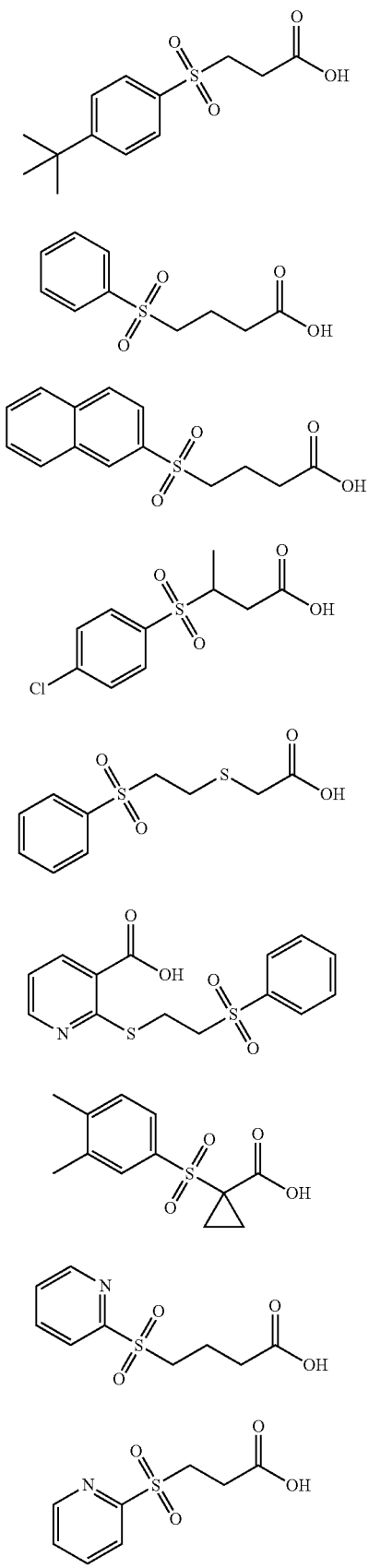
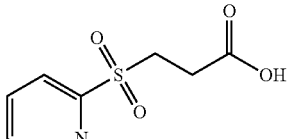
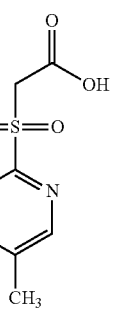
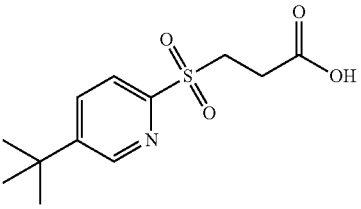
Examples of the compound of Formula (1b) include compounds of the following Formulae (1b-1) to (1b-20). Examples of the compound of Formula (3) include, but are not limited to, propylene glycol monomethyl ether and 4-methyl-2-pentanol.
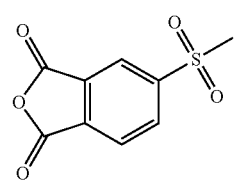
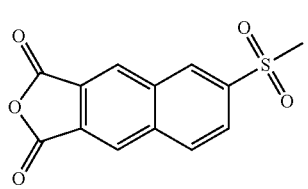
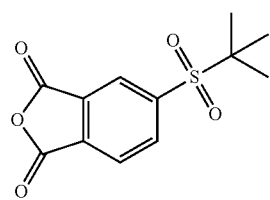

-continued
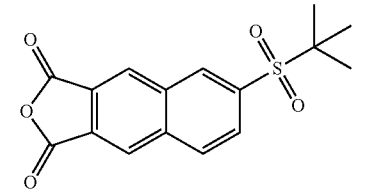
(1b-4)
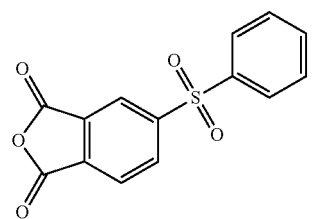
(1b-5)
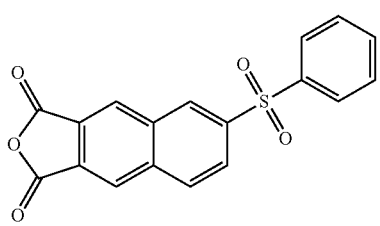
(1b-6)
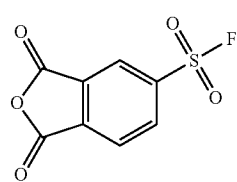
(1b-7)
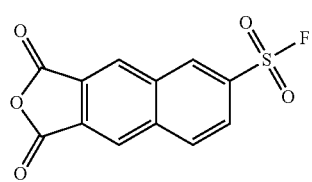
(1b-8)
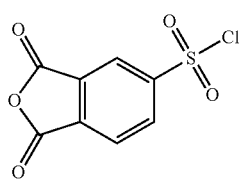
(1b-9)
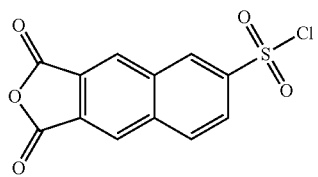
(1b-10)
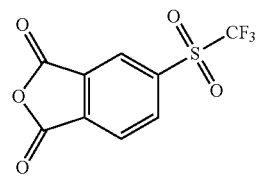
(1b-11)
-continued
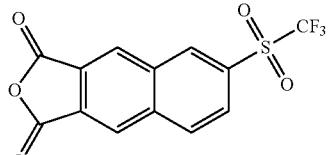
(1b-12)
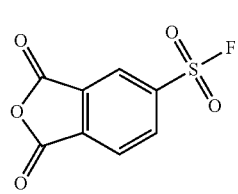
(1b-13)
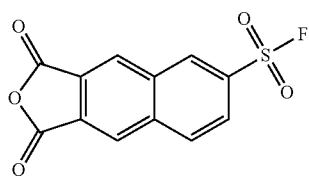
(1b-14)
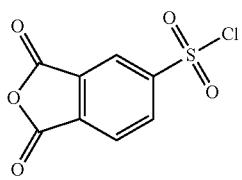
(1b-15)
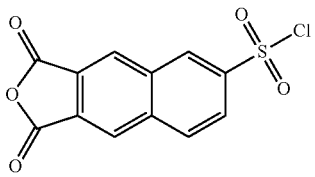
(1b-16)
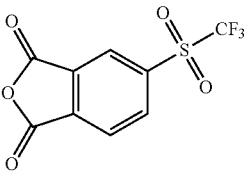
(1b-17)
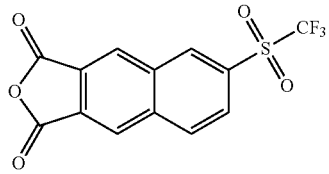
(1b-18)
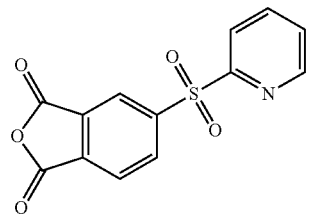
(1b-19)

(1b-20)
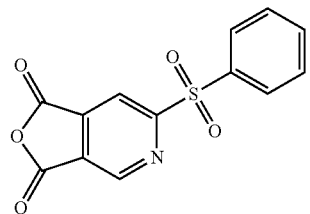
Examples of monomer forming the structural unit of Formula (4) include compounds of the following Formulae (4-1) to (4-16), which have two epoxy groups.
(4-1)
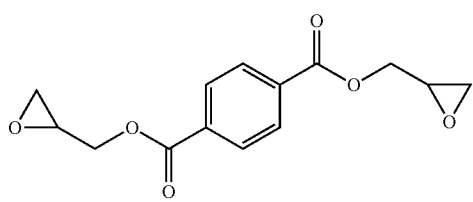
(4-2)
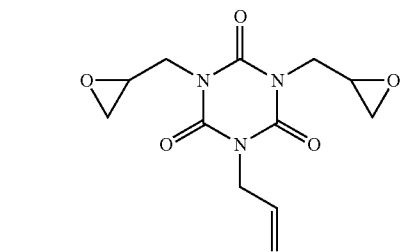
(4-3)
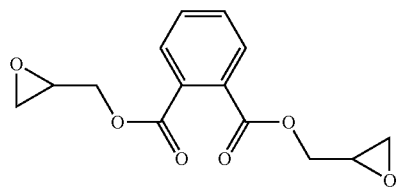
(4-4)
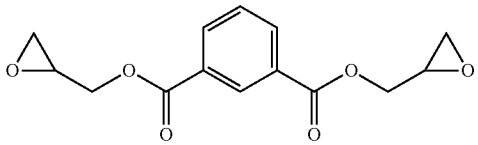
(4-5)
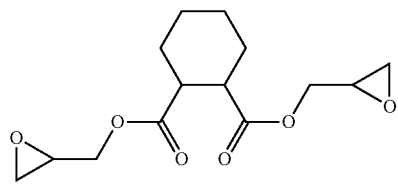
(4-6)
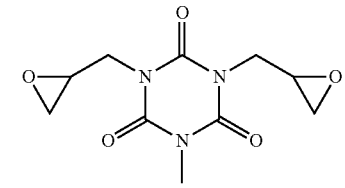
(4-7)
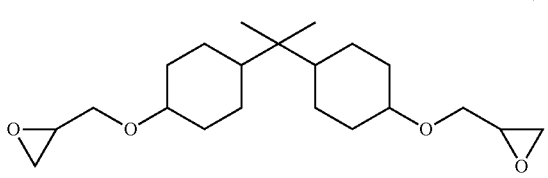
(4-8)
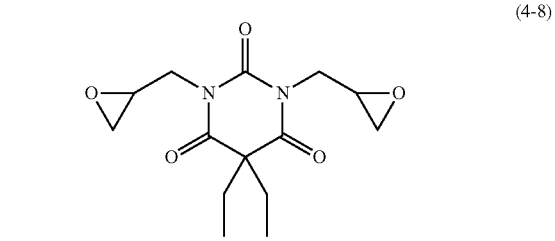
(4-9)
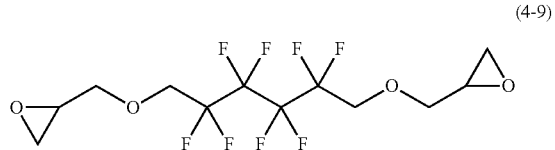
(4-10)
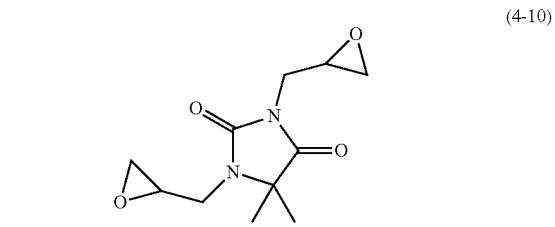
(4-11)
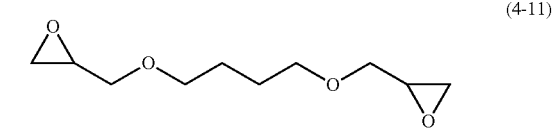
(4-12)
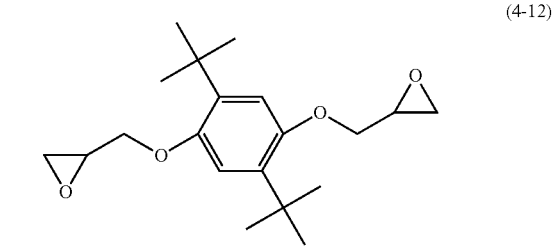
(4-13)
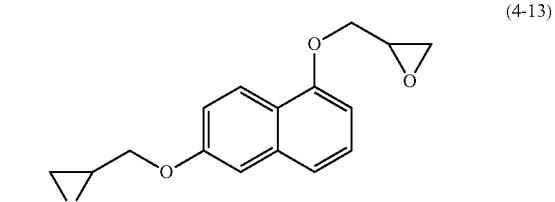
(4-14)
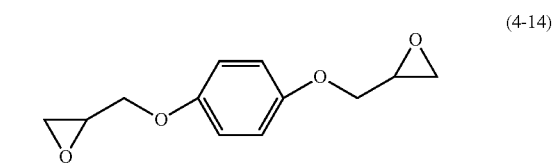

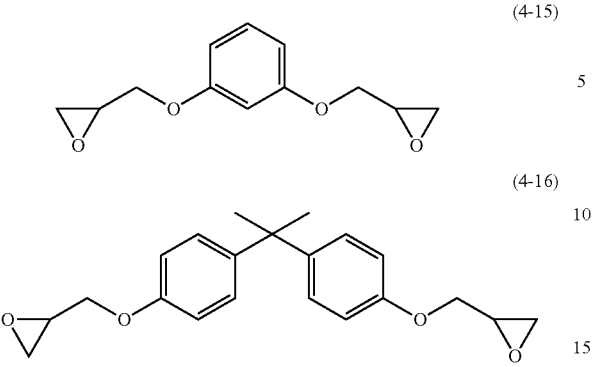

Examples of monomer forming the structural unit of Formula (5) include compounds of the following Formulae (5-1) to (5-12).

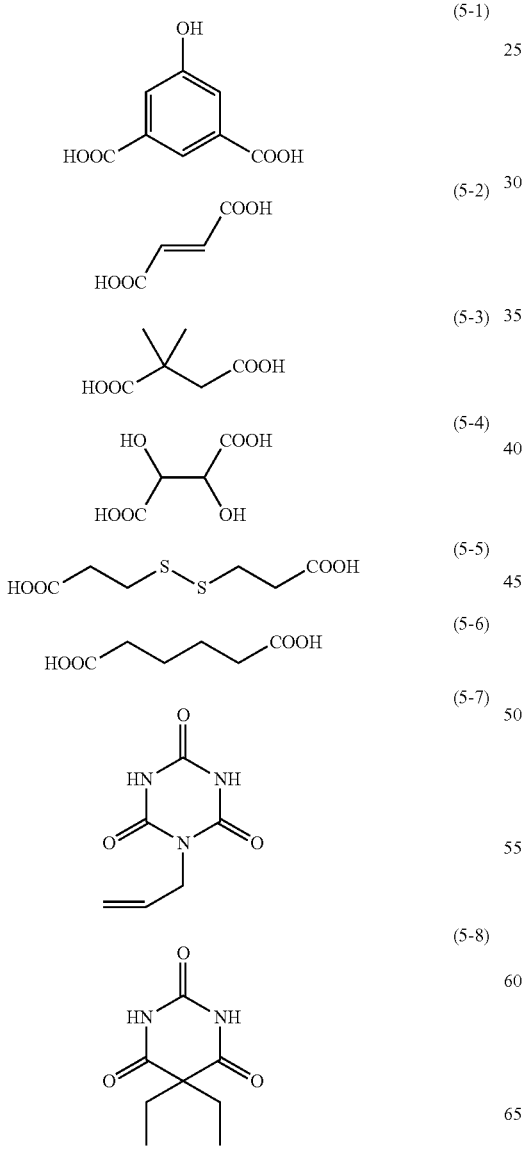

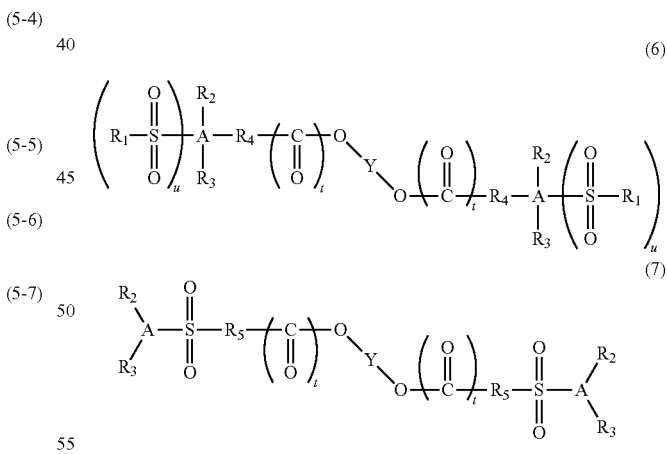

The polymer contained in the resist underlayer film-forming composition for lithography of the present invention is, for example, a polymer of the following Formula (6) or (7).

(wherein $R_1$, $R_2$, $R_3$, $R_4$, $R_5$, A, t, and u have the same definitions as those of $R_1$, $R_2$, $R_3$, $R_4$, $R_5$, X, A, t, and u in the structure of Formula (1) or (2), and Y is a polymer chain having the structural unit of Formula (4) and the structural unit of Formula (5).)

Among raw material monomers necessary for obtaining the polymer of Formula (6) or (7), the amount of the compound of Formula (1a), the compound of Formula (2a), or both the compound of Formula (1b) and the compound of Formula (3) is, for example, 1% by mass to 30% by mass (in terms of ratio of monomer to be mixed), and preferably 2% by mass to 20% by mass, relative to the total amount of the monomer forming the structural unit of Formula (4) and the monomer forming the structural unit of Formula (5) as 100% by mass.

The polymer contained in the resist underlayer film-forming composition for lithography of the present invention may be any of a random copolymer, a block copolymer, an alternating copolymer, and a graft copolymer. A polymerization method for the polymer may be various methods such as solution polymerization, suspension polymerization, emulsion polymerization, and bulk polymerization, and a polymerization catalyst or the like may be appropriately used.

In one example of the polymerization method, the polymer may be synthesized by adding the compound of Formula (1a) or the compound of Formula (2a) and a polymerization catalyst to the monomer forming the structural unit of Formula (4) and the monomer forming the structural unit of Formula (5) in an organic solvent, heating the mixture, resulting in polymerization. The organic solvent used herein can be appropriately selected from preferable examples of organic solvent that is contained in the resist underlayer film-forming composition for lithography of the present invention, described later. Examples of the polymerization catalyst include benzyltriethylammonium chloride and ethyltriphenylphosphonium bromide. The polymerization may be carried out by heating, for example, at 50° C. to 160° C., and preferably 70° C. to 130° C. The reaction time is, for example, 1 hour to 50 hours, and preferably 2 hours to 12 hours.

The weight average molecular weight of the polymer is, for example, 800 to 100,000, and preferably 800 to 10,000. When the weight average molecular weight is too high, the application property of the resist underlayer film-forming composition for lithography of the present invention is deteriorated. The amount of the polymer contained in the composition is, for example, 0.01% by mass to 3% by mass, and preferably 0.1% by mass to 2% by mass, relative to 100% by mass of the resist underlayer film-forming composition for lithography of the present invention.

[Crosslinker]

The resist underlayer film-forming composition for lithography of the present invention further contains a crosslinker. The crosslinker is not particularly limited, and a nitrogen-containing compound having at least two crosslinking-forming substituent (e.g., methylol group, methoxymethyl group, and butoxymethyl group) is preferably used.

Examples of the crosslinker include hexamethoxy methyl melamine, tetramethoxymethyl benzoguanamine, 1,3,4,6-tetrakis(methoxymethyl) glycoluril, 1,3,4,6-tetrakis(butoxymethyl) glycoluril, 1,3,4,6-tetrakis(hydroxymethyl) glycoluril, 1,3-bis(hydroxymethyl)urea, 1,1,3,3-tetrakis(butoxymethyl)urea, and 1,1,3,3-tetrakis(methoxymethyl)urea. The amount of the crosslinker contained in the composition is, for example, 1% by mass to 100% by mass, and preferably 10% by mass to 50% by mass, relative to 100% by mass of the polymer in the resist underlayer film-forming composition for lithography of the present invention. The crosslinker can be subjected to a crosslinking reaction with a crosslinking functional group (hydroxy group) in the polymer, and especially the structural unit of Formula (4) and the structural unit of Formula (5) to be reacted with the crosslinker to form crosslinking.

[Compound Promoting Crosslinking Reaction]

In order to promote the crosslinking reaction, the resist underlayer film-forming composition for lithography of the present invention further contains a compound promoting the crosslinking reaction. As such a compound, a sulfonic acid compound and a carboxylic acid compound such as p-toluenesulfonic acid, trifluoromethanesulfonic acid, pyridinium p-toluenesulfonate, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, and hydroxybenzoic acid may be used. Only one of the compounds promoting the crosslinking reaction may be used or two or more thereof may be used in combination. The amount of the compound promoting the crosslinking reaction contained in the composition is, for example, 0.1% by mass to 25% by mass, and preferably 1% by mass to 10% by mass, relative to 100% by mass of the polymer in the resist underlayer film-forming composition for lithography of the present invention.

[Organic Solvent]

The resist underlayer film-forming composition for lithography of the present invention further contains an organic solvent. The organic solvent used in the present invention is not particularly limited as long as the polymer can be dissolved in it. For example, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monopropyl ether, 1-ethoxy-2-propanol, propylene glycol monomethyl ether acetate, propylene glycol propyl ether acetate, 1-methoxy-2-butanol, 2-methoxy-1-buthanol, 3-methoxy-3-methyl butanol, 3-methoxy-1 buthanol, toluene, xylene, methyl ethyl ketone, cyclopentanone, cyclohexanone, γ-butyrolactone, N-methyl-2-pyrrolidone, methyl 2-hydroxyisobutyrate, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, or butyl lactate may be used. The organic solvent may be used alone, or two or more thereof may be used in combination.

Among the organic solvents, propylene glycol monomethyl ether, propylene glycol monomethyl ether acetate, 1-ethoxy-2-propanol, ethyl lactate, butyl lactate, and cyclohexanone are preferred. The amount of the organic solvent contained in the composition is, for example, 90% by mass to 99.99% by mass, and preferably 98% by mass to 99.9% by mass, relative to 100% by mass of the resist underlayer film-forming composition for lithography of the present invention. Herein, a component other than organic solvent in the resist underlayer film-forming composition is referred to as solid content.

[Acid Generator]

The resist underlayer film-forming composition for lithography of the present invention may further contain an acid generator. Examples of such an acid generator include bis(4-hydroxyphenyl)sulfone. When the resist underlayer film-forming composition for lithography of the present invention contains the acid generator, the amount thereof is, for example, 0.1% by mass to 5% by mass, and preferably 0.2% by mass to 3% by mass relative to 100% by mass of the polymer in the composition.

[Other Additives]

The resist underlayer film-forming composition for lithography of the present invention may further contain various types of additive such as a surfactant, if necessary, as long as the effects of the present invention are not impaired. The surfactant is an additive to improve the application property of the composition to the substrate. A publicly known surfactant such as a nonionic surfactant and a fluorosurfactant can be used.

Specific examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and fluorosurfactants including Eftop (registered trademark) EF301, EF303, and EF352 (available from Mitsubishi Materials Electronic Chemicals Co., Ltd.), MEGAFACE (registered trademark) F171, F173, R-30, R-40, and R-40-LM (available from DIC Corporation), Fluorad FC430 and FC431 (available from Sumitomo 3M, Ltd.), and Asahi Guard (registered trademark) AG710, and Surflon (registered trademark) S-382, SC101, SC102, SC103, SC104, SC105, and SC106 (available from Asahi Glass Co., Ltd.), and organosiloxane polymer KP341 (available from Shin-Etsu Chemical Co., Ltd.). The surfactant may be added alone or two or more kinds thereof may be added in combination.

When the resist underlayer film-forming composition for lithography of the present invention contains the surfactant, the amount thereof is, for example, 0.1% by mass to 5% by mass, and preferably 0.2% by mass to 3% by mass relative to 100% by mass of the polymer in the composition.

Hereinafter, a method for forming a resist pattern of the present invention will be described. The resist underlayer film-forming composition for lithography of the present invention is first applied to a substrate used in production of a precision integrated circuit element (e.g., a semiconductor substrate such as a silicon wafer coated with a silicon oxide film, a silicon nitride film, or a silicon nitride oxide film, a silicon nitride substrate, a quartz substrate, a glass substrate (including an alkali-free glass substrate, a low alkaline glass substrate, and a crystalline glass substrate), and a glass substrate having an ITO film) by an appropriate applying procedure using a spinner, a coater, or the like, and then baked by a heating means such as a hot plate and cured to form a resist underlayer film.

For example, a baking condition after the application is appropriately selected from a baking temperature of 80° C. to 250° C. and a baking time of 0.3 minutes to 60 minutes. It is preferable that the baking temperature be 150° C. to 250° C. and the baking time be 0.5 minutes to 5 minutes. When the composition is baked under such conditions, a crosslinking moiety such as a hydroxy group in the structural unit of the polymer is reacted with the crosslinker to form a crosslinking structure. In particular, when the polymer contained in the resist underlayer film-forming composition for lithography of the present invention is crosslinked, the crosslink density of the crosslinking polymer can be increased. For example, the resist underlayer film has a thickness of 0.001 μm (1 nm) to 0.2 μm (200 nm), and preferably 0.003 μm (3 nm) to 0.1 μm (100 nm).

Subsequently, a resist film is formed on the formed resist underlayer film. The resist film can be formed by a general method, that is, by applying a resist solution to the resist underlayer film, followed by baking. As the resist solution to be applied, for example, a negative or positive resist solution may be used without particular limitation as long as it can be sensitive to a KrF excimer laser, an ArF excimer laser, EUV, or an electron beam. Examples of usable resist solution include PAR710 and PAR855 (trade name), available from Sumitomo Chemical Co., Ltd., AR2772JN (trade name) available from JSR Corporation, SEPR430 (trade name) available from Shin-Etsu Chemical Co., Ltd., and APEX-X (trade name) available from Dow Chemical Company (Rohm and Haas Electronic Materials LLC).

Subsequently, the resist film formed on the resist underlayer film is exposed to light through a predetermined mask (reticle). For example, a KrF excimer laser, an ArF excimer laser, or EUV can be used for exposure. In a case of exposure using an electron beam, a mask (reticle) is not required. After the exposure, post exposure bake (PEB) can be carried out, if necessary. A condition of post exposure bake is appropriately selected from a heating temperature of 80° C. to 150° C. and a heating time of 0.3 minutes to 60 minutes.

After the exposure, development, rinsing, and drying are carried out to obtain a good resist pattern. As a developer for the resist film, an aqueous alkali solution or an organic solvent can be used. Examples of the alkaline aqueous solution include: aqueous solutions of inorganic alkalis such as sodium hydroxide, potassium hydroxide, sodium carbonate, sodium silicate, sodium metasilicate, and ammonia water; aqueous solutions of primary amines such as ethylamine and n-propylamine; aqueous solutions of secondary amines such as diethylamine and di-n-butylamine; aqueous solutions of tertiary amines such as triethylamine and methyldiethylamine; aqueous solutions of alcoholamines such as dimethylethanolamine and triethanolamine; aqueous solutions of quaternary ammonium salts such as tetramethylammonium hydroxide, tetraethylammonium hydroxide, and choline; and aqueous solutions of cyclic amines such as pyrrole and piperidine. A developer in which proper amounts of an alcohol such as isopropyl alcohol and a surfactant such as a nonionic surfactant are added to the aqueous solution of the alkali can be used. Among the developers, an aqueous solution of quaternary ammonium salt is preferred, and an aqueous solution of tetramethylammonium hydroxide is further preferred. Examples of the organic solvent used as the developer include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these, butyl acetate is preferred. A development condition is appropriately selected from a development temperature of 5° C. to 50° C. and a development time of 10 seconds to 300 seconds.

The resist underlayer film at an exposed area where the resist film is developed and removed at the above step can be removed by dry etching, to form a desired pattern on the substrate.

EXAMPLES

Hereinafter, the present invention will be described in detail with reference to Synthesis Examples and Examples, but the present invention is not especially limited to the following description.

Weight average molecular weights shown in the following Synthesis Examples 1 to 10 and Comparative Synthesis Examples 1 and 2 are results measured by gel permeation chromatography (hereinafter abbreviated as GPC in the specification). In the measurement, a GPC device manufactured by TOSOH CORPORATION was used, and measurement conditions were as follows. A degree of distribution shown in the following Synthesis Examples herein is calculated from the measured weight average molecular weight and a number average molecular weight.

GPC column: Shodex (registered trademark) Asahipak (registered trademark) (manufactured by Showa Denko K.K.)
Column temperature: 40° C.
Solvent: N,N-dimethyl formamide (DMF)
Flow rate: 0.6 mL/min
Standard sample: polystyrene (available from TOSOH CORPORATION)
Detector: RI detector (RI-8020 manufactured by TOSOH CORPORATION)

Synthesis Example 1

In a reactor, 7.00 g of monoallyl diglycidyl isocyanurate (available from Shikoku Chemicals Corporation), 3.93 g of 5,5-diethyl barbituric acid (available from HACHIDAI PHARMACEUTICAL CO., LTD.), 1.51 g of 4-(methylsulfonyl)benzoic acid (available from Tokyo Chemical Industry Co., Ltd.), and 0.47 g of ethyltriphenylphosphonium bromide (available from Sigma-Aldrich) were added to 73.14 g of propylene glycol monomethyl ether and dissolved. The reactor was purged with nitrogen, and a reaction was caused at 135° C. for 4 hours to obtain a polymer solution. The polymer solution was not clouded even under cooling to room temperature. The polymer solution has good solubility in propylene glycol monomethyl ether. The polymer in the obtained solution was analyzed by GPC. The weight average molecular weight in terms of standard polystyrene was 2,600. The degree of distribution was 3.448. The polymer obtained in this Synthesis Example has structural units of the following Formulae (4a-1) and (5a-1) and a structure of the following Formula (1-1) at a terminal.

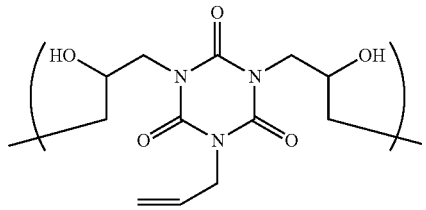

(4a-1)

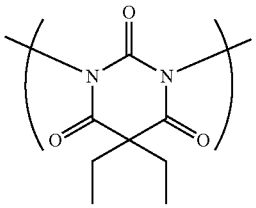

(5a-1)

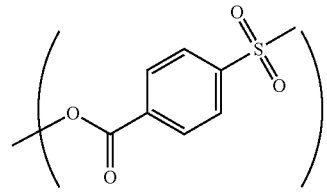

(1-1)

Synthesis Example 2

In a reactor, 7.42 g of hydantoin diglycidyl (available from Shikoku Chemicals Corporation), 4.83 g of 5,5-diethyl barbituric acid (available from HACHIDAI PHARMACEUTICAL CO., LTD.), 1.85 g of 4-(methylsulfonyl)benzoic acid (available from Tokyo Chemical Industry Co., Ltd.), and 0.57 g of ethyltriphenylphosphonium bromide (available from Sigma-Aldrich) were added to 83.21 g of propylene glycol monomethyl ether and dissolved. The reactor was purged with nitrogen, and a reaction was caused at 135° C. for 4 hours to obtain a polymer solution. The polymer solution was not clouded even under cooling to room temperature. The polymer solution has good solubility in propylene glycol monomethyl ether. The polymer in the obtained solution was analyzed by GPC. The weight average molecular weight in terms of standard polystyrene was 2,590. The degree of distribution was 2.77. The polymer obtained in this Synthesis Example has structural units of the following Formulae (4b-1) and (5a-1) and a structure of the following Formula (1-1) at a terminal.

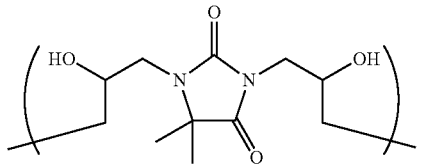

(4b-1)

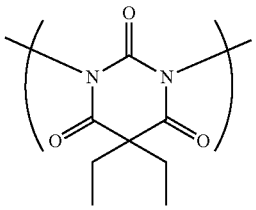

(5a-1)

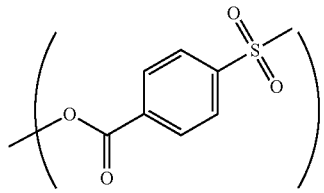

Synthesis Example 3

In a reactor, 10.06 g of hydantoin diglycidyl (available from Shikoku Chemicals Corporation), 6.01 g of monoallyl cyanurate (available from Shikoku Chemicals Corporation), 2.51 g of 4-(methylsulfonyl)benzoic acid (available from Tokyo Chemical Industry Co., Ltd.), and 0.78 g of ethyltriphenylphosphonium bromide (available from Sigma-Aldrich) were added to 109.73 g of propylene glycol monomethyl ether and dissolved. The reactor was purged with nitrogen, and a reaction was caused at 135° C. for 4 hours to obtain a polymer solution. The polymer solution was not clouded even under cooling to room temperature. The polymer solution has good solubility in propylene glycol monomethyl ether. The polymer in the obtained solution was analyzed by GPC. The weight average molecular weight in terms of standard polystyrene was 3,240. The degree of distribution was 2.265. The polymer obtained in this Synthesis Example has structural units of the following Formulae (4b-1) and (5b-1) and a structure of the following Formula (1-1) at a terminal.

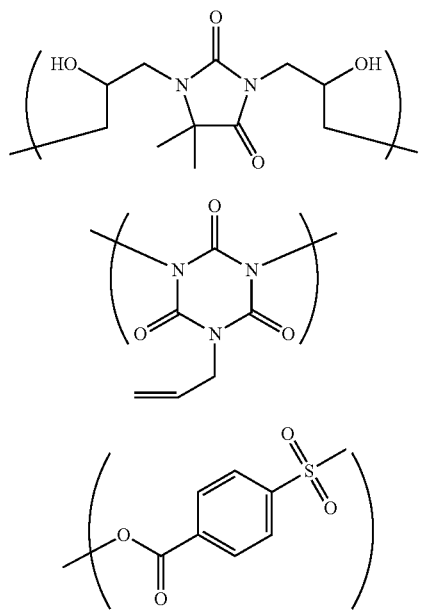

Synthesis Example 4

In a reactor, 10 g of monomethyl diglycidyl isocyanurate (available from Shikoku Chemicals Corporation, solid content: 48.7% by mass), 4.18 g of 3,3'-dithiopropionic acid (available from Sakai Chemical Industry Co., Ltd.), 0.65 g of 5-sulfosalicylic acid (available from Tokyo Chemical Industry Co., Ltd.), and 0.37 g of ethyltriphenylphosphonium bromide were added to 35 g of propylene glycol monomethyl ether and dissolved. The reactor was purged with nitrogen, and a reaction was caused at 105° C. for 24 hours to obtain a polymer solution. GPC analysis was carried out. The weight average molecular weight in terms of standard polystyrene was 1,100. The polymer obtained in this Synthesis Example has structural units of the following Formulae (4a-2) and (5c-1) and a structure of the following Formula (1-2) at a terminal. An epoxy group of monomethyl diglycidyl isocyanurate is considered to preferentially react with a carboxyl group as compared with a hydroxy group of 5-sulfosalicylic acid.

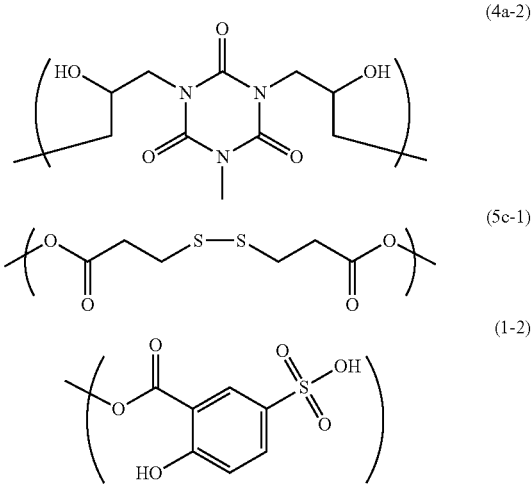

Synthesis Example 5

In a reactor, 10 g of monomethyl diglycidyl isocyanurate (available from Shikoku Chemicals Corporation, solid content: 48.7% by mass), 4.18 g of 3,3'-dithiopropionic acid (available from Sakai Chemical Industry Co., Ltd.), 0.87 g of 5-sulfosalicylic acid (available from Tokyo Chemical Industry Co., Ltd.), and 0.37 g of ethyltriphenylphosphonium bromide were added to 36 g of propylene glycol monomethyl ether and dissolved. The reactor was purged with nitrogen, and a reaction was caused at 105° C. for 24 hours to obtain a polymer solution. GPC analysis was carried out. The weight average molecular weight in terms of standard polystyrene was 910. The polymer obtained in this Synthesis Example has structural units of the following Formulae (4a-2) and (5c-1) and a structure of the following Formula (1-2) at a terminal.

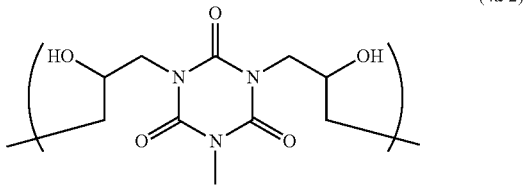

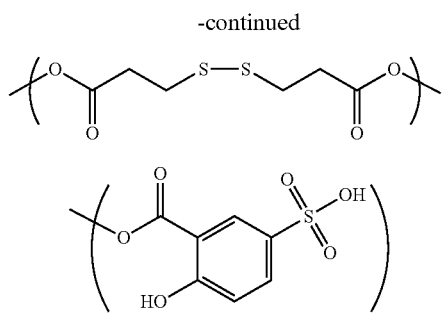

Synthesis Example 6

In a reactor, 10 g of monomethyl diglycidyl isocyanurate (available from Shikoku Chemicals Corporation, solid content: 50% by mass), 4.18 g of 3,3'-dithiopropionic acid (available from Sakai Chemical Industry Co., Ltd.), 1.3 g of 5-sulfosalicylic acid (available from Tokyo Chemical Industry Co., Ltd.), and 0.37 g of ethyltriphenylphosphonium bromide were added to 38.4 g of propylene glycol monomethyl ether and dissolved. The reactor was purged with nitrogen, and a reaction was caused at 105° C. for 24 hours to obtain a polymer solution. GPC analysis was carried out. The weight average molecular weight in terms of standard polystyrene was 890. The polymer obtained in this Synthesis Example has structural units of the following Formulae (4a-2) and (5c-1) and a structure of the following Formula (1-2) at a terminal.

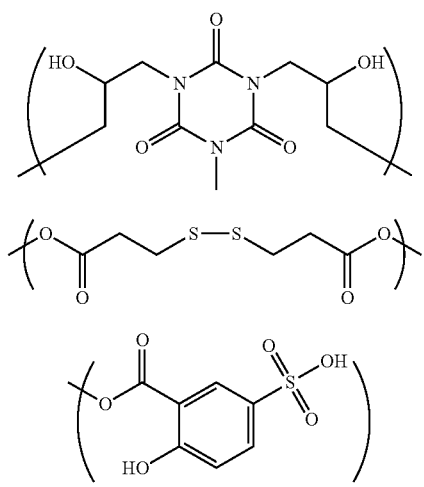

Synthesis Example 7

In a reactor, 10 g of monomethyl diglycidyl isocyanurate (available from Shikoku Chemicals Corporation, solid content: 50% by mass), 4.18 g of 3,3'-dithiopropionic acid (available from Sakai Chemical Industry Co., Ltd.), 0.80 g of 4-(methylsulfonyl)benzoic acid (available from Tokyo Chemical Industry Co., Ltd.), and 0.37 g of ethyltriphenylphosphonium bromide were added to 36.38 g of propylene glycol monomethyl ether and dissolved. The reactor was purged with nitrogen, and a reaction was caused at 105° C. for 24 hours to obtain a polymer solution. GPC analysis was carried out. The weight average molecular weight in terms of standard polystyrene was 2,500. The polymer obtained in this Synthesis Example has structural units of the following Formulae (4a-2) and (5c-1) and a structure of the following Formula (1-1) at a terminal.

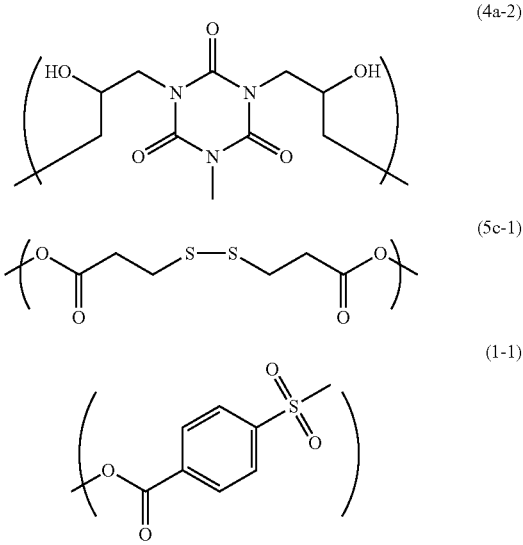

Synthesis Example 8

In a reactor, 10 g of monomethyl diglycidyl isocyanurate (available from Shikoku Chemicals Corporation, solid content: 50% by mass), 4.18 g of 3,3'-dithiopropionic acid (available from Sakai Chemical Industry Co., Ltd.), 1.19 g of 4-(methylsulfonyl)benzoic acid (available from Tokyo Chemical Industry Co., Ltd.), and 0.37 g of ethyltriphenylphosphonium bromide were added to 37.98 g of propylene glycol monomethyl ether and dissolved. The reactor was purged with nitrogen, and a reaction was caused at 105° C. for 24 hours to obtain a polymer solution. GPC analysis was carried out. The weight average molecular weight in terms of standard polystyrene was 1,650. The polymer obtained in this Synthesis Example has structural units of the following Formulae (4a-2) and (5c-1) and a structure of the following Formula (1-1) at a terminal.

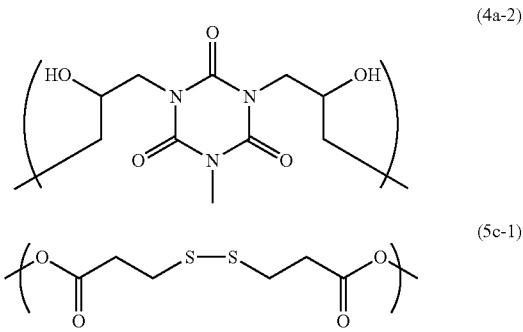

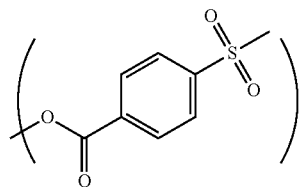

(1-1)

Synthesis Example 9

In a reactor, 10 g of monomethyl diglycidyl isocyanurate (available from Shikoku Chemicals Corporation, solid content: 50% by mass), 4.18 g of 3,3'-dithiopropionic acid (available from Sakai Chemical Industry Co., Ltd.), 0.85 g of 2-(p-toluenesulfonyl)acetic acid (available from Tokyo Chemical Industry Co., Ltd.), and 0.37 g of ethyltriphenylphosphonium bromide were added to 36.61 g of propylene glycol monomethyl ether and dissolved. The reactor was purged with nitrogen, and a reaction was caused at 105° C. for 24 hours to obtain a polymer solution. GPC analysis was carried out. The weight average molecular weight in terms of standard polystyrene was 3,300. The polymer obtained in this Synthesis Example has structural units of the following Formulae (4a-2) and (5c-1) and a structure of the following Formula (2-1) at a terminal.

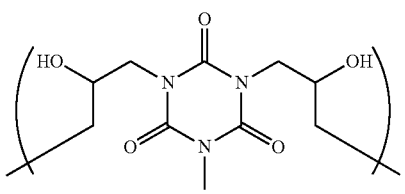

(4a-2)

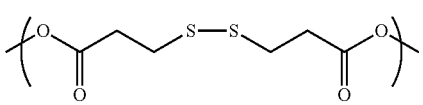

(5c-1)

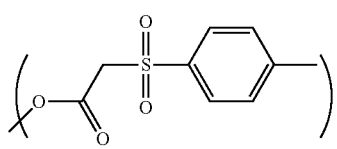

(2-1)

Synthesis Example 10

In a reactor, 10 g of monomethyl diglycidyl isocyanurate (available from Shikoku Chemicals Corporation, solid content: 50% by mass), 4.18 g of 3,3'-dithiopropionic acid (available from Sakai Chemical Industry Co., Ltd.), 1.28 g of 2-(p-toluenesulfonyl)acetic acid (available from Tokyo Chemical Industry Co., Ltd.), and 0.37 g of ethyltriphenylphosphonium bromide were added to 38.31 g of propylene glycol monomethyl ether and dissolved. The reactor was purged with nitrogen, and a reaction was caused at 105° C. for 24 hours to obtain a polymer solution. GPC analysis was carried out. The weight average molecular weight in terms of standard polystyrene was 2,600. The polymer obtained in this Synthesis Example has structural units of the following Formulae (4a-2) and (5c-1) and a structure of the following Formula (2-1) at a terminal.

Comparative Synthesis Example 1

In a reactor, 5.00 g of terephthalic acid diglycidyl ester (trade name: Denacol (registered trademark) EX711, available from Nagase ChemteX Corporation), 3.15 g of 5-hydroxyisophthalic acid (available from Tokyo Chemical Industry Co., Ltd.), and 0.20 g of benzyltriethylammonium chloride (available from Tokyo Chemical Industry Co., Ltd.) were added to 35.60 g of propylene glycol monomethyl ether and dissolved. The reactor was purged with nitrogen, and a reaction was caused at 135° C. for 4 hours to obtain a polymer solution. The polymer solution was not clouded even under cooling to room temperature. The polymer solution has good solubility in propylene glycol monomethyl ether. The polymer in the obtained solution was analyzed by GPC. The weight average molecular weight in terms of standard polystyrene was 15,700. The degree of distribution was 3.39. The polymer obtained in this Synthesis Example has structural units of the following Formulae (4c-1) and (5d-1), but does not have a structure of the above Formula (1) or (2) at a terminal.

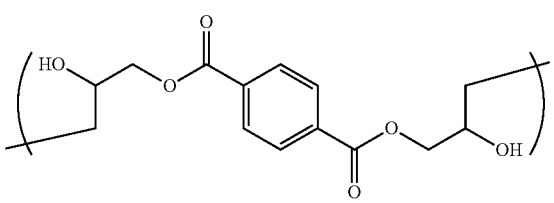

(4c-1)

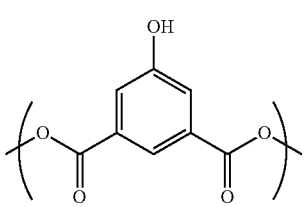

(5d-1)

Comparative Synthesis Example 2

In a reactor, 10 g of monomethyl diglycidyl isocyanurate (available from Shikoku Chemicals Corporation, solid content: 50% by mass), 4.18 g of 3,3'-dithiopropionic acid (available from Sakai Chemical Industry Co., Ltd.), and 0.36 g of ethyltriphenylphosphonium bromide were added to 33 g of propylene glycol monomethyl ether and dissolved. The reactor was purged with nitrogen, and a reaction was caused at 105° C. for 24 hours to obtain a polymer solution. GPC analysis was carried out. The weight average molecular weight in terms of standard polystyrene was 2,500. The polymer obtained in this Synthesis Example has structural units of the following Formulae (4a-2) and (5c-1), but does not have a structure of the above Formula (1) or (2) at a terminal.

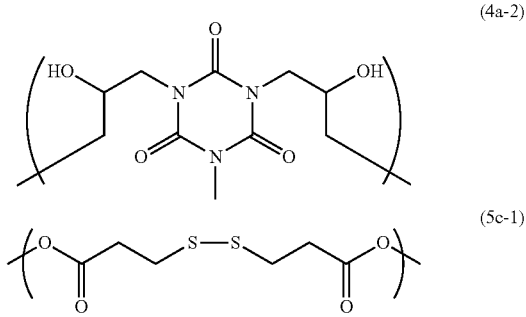

(4a-2)

(5c-1)

Example 1

0.1563 g of tetramethoxymethyl glycoluril (trade name: POWDERLINK (registered trademark) 1174, available from Nihon Cytec Industries Inc.), 0.0016 g of p-phenolsulfonic acid (available from Tokyo Chemical Industry Co., Ltd.), and 0.0031 g of surfactant (trade name: MEGAFACE (registered trademark) R-40, available from DIC Corporation) were mixed in 4.82 g of polymer solution containing 0.63 g of the polymer obtained in Synthesis Example 1. To the mixture, 67.00 g of propylene glycol monomethyl ether and 7.92 g of propylene glycol monomethyl ether acetate were added and dissolved. Then, the solution was filtered through a microfilter made of polyethylene with a pore diameter of 0.05 μm to obtain a resist underlayer film-forming composition for lithography.

Example 2

0.1563 g of tetramethoxymethyl glycoluril (trade name: POWDERLINK (registered trademark) 1174, available from Nihon Cytec Industries Inc.), 0.0016 g of p-phenolsulfonic acid (available from Tokyo Chemical Industry Co., Ltd.), and 0.0031 g of surfactant (trade name: MEGAFACE (registered trademark) R-40, available from DIC Corporation) were mixed in 4.91 g of polymer solution containing 0.63 g of the polymer obtained in Synthesis Example 2. To the mixture, 67.00 g of propylene glycol monomethyl ether and 7.92 g of propylene glycol monomethyl ether acetate were added and dissolved. Then, the solution was filtered through a microfilter made of polyethylene with a pore diameter of 0.05 μm to obtain a resist underlayer film-forming composition for lithography.

Example 3

0.059 g of tetramethoxymethyl glycoluril (trade name: POWDERLINK (registered trademark) 1174, available from Nihon Cytec Industries Inc.), 0.0059 g of p-phenolsulfonic acid (available from Tokyo Chemical Industry Co., Ltd.), and 0.0011 g of surfactant (trade name: MEGAFACE (registered trademark) R-40, available from DIC Corporation) were mixed in 1.73 g of polymer solution containing 0.23 g of the polymer obtained in Synthesis Example 3. To the mixture, 25.29 g of propylene glycol monomethyl ether and 2.97 g of propylene glycol monomethyl ether acetate were added and dissolved. After then, the solution was filtered through a microfilter made of polyethylene with a pore diameter of 0.05 μm to obtain a resist underlayer film-forming composition for lithography.

Example 4

0.059 g of tetramethoxymethyl glycoluril (trade name: POWDERLINK (registered trademark) 1174, available from Nihon Cytec Industries Inc.) and 0.0059 g of 5-sulfosalicylic acid (available from Tokyo Chemical Industry Co., Ltd.) were mixed in 1.14 g of solution of the polymer obtained in Synthesis Example 4. To the mixture, 27.68 g of propylene glycol monomethyl ether was added and dissolved to obtain a resist underlayer film-forming composition for lithography.

Example 5

0.059 g of tetramethoxymethyl glycoluril (trade name: POWDERLINK (registered trademark) 1174, available from Nihon Cytec Industries Inc.) and 0.0059 g of 5-sulfosalicylic acid (available from Tokyo Chemical Industry Co., Ltd.) were mixed in 1.10 g of solution of the polymer obtained in Synthesis Example 5. To the mixture, 27.73 g of propylene glycol monomethyl ether was added and dissolved to obtain a resist underlayer film-forming composition for lithography.

Example 6

0.071 g of tetramethoxymethyl glycoluril (trade name: POWDERLINK (registered trademark) 1174, available from Nihon Cytec Industries Inc.) and 0.0071 g of 5-sulfosalicylic acid (available from Tokyo Chemical Industry Co., Ltd.) were mixed in 1.32 g of solution of the polymer obtained in Synthesis Example 6. To the mixture, 27.27 g of propylene glycol monomethyl ether was added and dissolved to obtain a resist underlayer film-forming composition for lithography.

Example 7

0.059 g of tetramethoxymethyl glycoluril (trade name: POWDERLINK (registered trademark) 1174, available from Nihon Cytec Industries Inc.) and 0.0059 g of 5-sulfosalicylic acid (available from Tokyo Chemical Industry Co., Ltd.) were mixed in 1.47 g of solution of the polymer obtained in Synthesis Example 7. To the mixture, 27.35 g of propylene glycol monomethyl ether was added and dissolved to obtain a resist underlayer film-forming composition for lithography.

Example 8

0.059 g of tetramethoxymethyl glycoluril (trade name: POWDERLINK(registered trademark) 1174, available from Nihon Cytec Industries Inc.) and 0.0059 g of 5-sulfosalicylic acid (available from Tokyo Chemical Industry Co., Ltd.)

were mixed in 1.58 g of solution of the polymer obtained in Synthesis Example 8. To the mixture, 27.24 g of propylene glycol monomethyl ether was added and dissolved to obtain a resist underlayer film-forming composition for lithography.

Example 9

0.059 g of tetramethoxymethyl glycoluril (trade name: POWDERLINK(registered trademark) 1174, available from Nihon Cytec Industries Inc.) and 0.0059 g of 5-sulfosalicylic acid (available from Tokyo Chemical Industry Co., Ltd.) were mixed in 1.46 g of solution of the polymer obtained in Synthesis Example 9. To the mixture, 22.07 g of propylene glycol monomethyl ether was added and dissolved to obtain a resist underlayer film-forming composition for lithography.

Example 10

0.059 g of tetramethoxymethyl glycoluril (trade name: POWDERLINK(registered trademark) 1174, available from Nihon Cytec Industries Inc.) and 0.0059 g of 5-sulfosalicylic acid (available from Tokyo Chemical Industry Co., Ltd.) were mixed in 1.49 g of solution of the polymer obtained in Synthesis Example 10. To the mixture, 22.04 g of propylene glycol monomethyl ether was added and dissolved to obtain a resist underlayer film-forming composition for lithography.

Comparative Example 1

0.059 g of tetramethoxymethyl glycoluril (trade name: POWDERLINK (registered trademark) 1174, available from Nihon Cytec Industries Inc.) and 0.0058 g of 5-sulfosalicylic acid were mixed in 1.31 g of solution of the polymer containing 0.23 g of the polymer obtained in Comparative Synthesis Example 1. To the mixture, 21.27 g of propylene glycol monomethyl ether and 8.91 g of propylene glycol monomethyl ether acetate were added and dissolved. Then, the solution was filtered through a microfilter made of polyethylene with a pore diameter of 0.05 μm to obtain a resist underlayer film-forming composition for lithography.

Comparative Example 2

0.23 g of tetramethoxymethyl glycoluril (trade name: POWDERLINK (registered trademark) 1174, available from Nihon Cytec Industries Inc.), 0.023 g of p-phenolsulfonic acid (available from Tokyo Chemical Industry Co., Ltd.), and 0.0046 g of surfactant (trade name: MEGAFACE (registered trademark) R-40, available from DIC Corporation) were mixed in 5.16 g of polymer solution containing 0.94 g of the polymer having structural units of the following Formula (4a-1) and (5a-1) obtained in Synthesis Example 1 described in Patent Document 1. To the mixture, 50.93 g of propylene glycol monomethyl ether and 23.64 g of propylene glycol monomethyl ether acetate were added and dissolved. Then, the solution was filtered through a microfilter made of polyethylene with a pore diameter of 0.05 μm to obtain a resist underlayer film-forming composition for lithography.

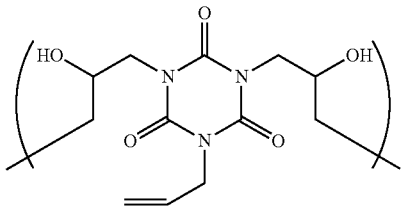

(4a-1)

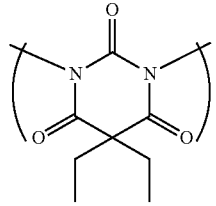

(5a-1)

Comparative Example 3

0.055 g of tetramethoxymethyl glycoluril (trade name: POWDERLINK (registered trademark) 1174, available from Nihon Cytec Industries Inc.) and 0.0055 g of 5-sulfosalicylic acid (available from Tokyo Chemical Industry Co., Ltd.) were mixed in 1.38 g of solution of the polymer obtained in Comparative Synthesis Example 2. To the mixture, 27.52 g of propylene glycol monomethyl ether was added and dissolved to obtain a resist underlayer film-forming composition for lithography.

[Elution Test into Photoresist Solvent]

Each resist underlayer film-forming composition of Examples 1 to 10 and Comparative Examples 1 to 3 was applied to a silicon wafer as a semiconductor substrate using a spinner. Each silicon wafer was disposed on a hot plate, and baked at 205° C. for 1 minute to form a resist underlayer film (thickness: 0.05 μm). Each resist underlayer film was immersed in ethyl lactate and propylene glycol monomethyl ether as solvents used for a photoresist. It was confirmed that the resist underlayer films were insoluble in the solvents.

[Application Property Test of Thin Film] Each resist underlayer film-forming composition of Examples 1 to 3 and Comparative Example 1 was applied so as to have a thickness of 5 nm to a silicon wafer having a structure with a top surface and a cross section shown in FIG. 1 and a square pattern of 13 μm in length, 13 μm in width, and 230 nm in height, and a cruciform pattern of 14 μm in length, 14 μm in width, and 230 nm in height. The application property was confirmed using a dark field of an optical microscope (MX61L manufactured by Olympus Corporation). Only when the resist underlayer film-forming compositions of Examples 1 to 3 were each applied, good application property was confirmed. On the other hand, when the resist underlayer film-forming composition of Comparative Example 1 was applied, uneven application was observed. Thus, poor application property was confirmed.

[Formation of Resist Pattern by ArF Exposure]

Each resist underlayer film-forming composition of Examples 4 to 10 and Comparative Example 3 was applied to a silicon wafer using a spinner. Each silicon wafer was baked on a hot plate at 205° C. for 60 seconds to form a resist underlayer film having a thickness of 28 nm. To the resist underlayer film, a positive resist solution for ArF excimer laser was applied by spin coating, and heated at 80° C. for 60 seconds to form an ArF resist film. The resist film was exposed by an exposure device for ArF excimer laser (NSR S307R, manufactured by Nikon Corporation) under a predetermined condition. After the exposure, the film was baked (PEB) at 95° C. for 60 seconds, cooled to room temperature on a cooling plate, developed by butyl acetate, and rinsed with butyl acetate, to form a resist pattern having a line width of 62 nm and a pitch of 124 nm. In measurement of length of the resist pattern, a scanning electron microscope (S-9380, manufactured by Hitachi High-Technologies Corporation) was used. An appropriate exposure dose was the exposure dose at which the resist pattern having a line width of 62 nm and a pitch of 124 nm (line-and-space (L/S=1/1) in the formation of the resist pattern. When the exposure dose is stepwise made smaller than this appropriate exposure dose, the line width of pattern to be obtained is gradually decreased, and the collapse of the resist pattern is finally observed. The smallest line width in which the collapse of resist pattern is not recognized is defined as the minimal dimension before collapse (nm), and is used as an indication of resistance to pattern collapse. Values of minimal dimension before collapse are shown in Table 1. When the minimal dimension before collapse is 50 nm or less, the resistance to pattern collapse is judged to be "good," and when it is more than 50 nm, the resistance to pattern collapse is judged to be "poor."

TABLE 1

|  | Minimal Dimension Before Collapse | Resistance to Pattern Collapse |
|---|---|---|
| Example 4 | 45.31 nm | Good |
| Example 5 | 45.07 nm | Good |
| Example 6 | 44.05 nm | Good |
| Example 7 | 45.28 nm | Good |
| Example 8 | 44.73 nm | Good |
| Example 9 | 48.49 nm | Good |
| Example 10 | 46.66 nm | Good |
| Comparative Example 3 | 51.89 nm | Poor |

[EUV Exposure Test]

Each of the resist underlayer film-forming compositions in Examples 1 and 2 and Comparative Example 1 of the present invention was applied to a silicon wafer by spin coating, and heated at 205° C. for 1 minute to form a resist underlayer film. To the resist underlayer film, a resist solution for EUV was applied by spin coating followed by heating, and exposed by an EUV exposure device (NXE3100, manufactured by ASML) under conditions of NA=0.25 Dipole. After the exposure, the film was subjected to PEB (post exposure bake), cooled to room temperature on a cooling plate, developed, and rinsed to form a resist pattern on the silicon wafer. A state of formation of line-and-space (L/S) of 25 nm, the line width roughness (LWR) of a line pattern formed during observation from a top surface of the line pattern, and the minimal dimension before collapse that was the smallest line width in which the collapse of resist pattern was not recognized were evaluated. The results of evaluation are shown in Table 2. A case where a line-and-space pattern is formed is evaluated as "good." For LWR, the size of variation of line pattern formed is shown in nm. It is preferable that the minimal dimension before collapse and LWR be smaller. In Examples 1 and 2, better minimal dimension before collapse and LWR are shown as compared with Comparative Example 1.

TABLE 2

|  | Minimal Dimension Before Collapse | LWR | State of Formation of L/S |
|---|---|---|---|
| Example 1 | 22.5 nm | 3.7 nm | Good |
| Example 2 | 22.6 nm | 3.5 nm | Good |
| Comparative Example 1 | 24.7 nm | 4.2 nm | Good |

The invention claimed is:

1. A resist underlayer film-forming composition for lithography containing a polymer having a structure of Formula (1) or (2) below at a terminal of a polymer chain, a crosslinker, a compound promoting a crosslinking reaction, and an organic solvent

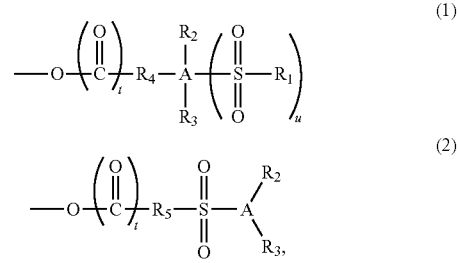

wherein the polymer is a reaction product of raw material monomers containing a compound of Formula (1a) below, a compound of Formula (2a) below, or both a compound of Formula (1b) below and a compound of Formula (3) below

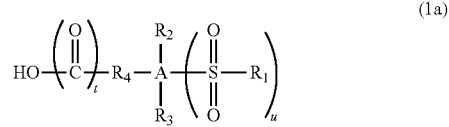

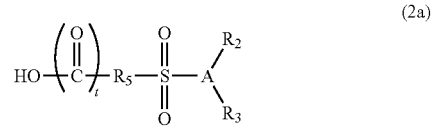

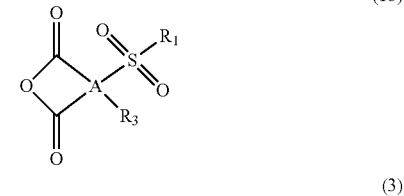

(wherein $R_1$ is a $C_{1-6}$ alkyl group optionally having a substituent, a phenyl group, a pyridyl group, a halogeno group, or a hydroxy group, $R_2$ is a hydrogen atom, a $C_{1-6}$ alkyl group, a hydroxy group, a halogeno group, or an ester group of —C(=O)O—X wherein X is a $C_{1-6}$ alkyl group optionally having a substituent, $R_3$ is a hydrogen atom, a $C_{1-6}$ alkyl group, a hydroxy group, or a halogeno group, $R_4$ is a direct bond or a divalent $C_{1-8}$ organic group, $R_5$ is a divalent $C_{1-8}$ organic group, A is an aromatic ring or a heteroaromatic ring, t is 0 or 1, and u is 1 or 2).

2. The resist underlayer film-forming composition for lithography according to claim 1, wherein the polymer has a structural unit of Formula (4) below and a structural unit of Formula (5) below

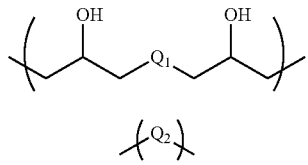

(4)

(5)

(wherein $Q_1$ and $Q_2$ are each independently a divalent organic group having a $C_{1-13}$ hydrocarbon group and optionally having a substituent, a divalent organic group having an aromatic ring, or a divalent organic group having a heterocycle containing 1 to 3 nitrogen atoms).

3. The resist underlayer film-forming composition for lithography according to claim 2, wherein the structural unit of Formula (4) is a structural unit of Formula (4a), (4b), or (4c) below

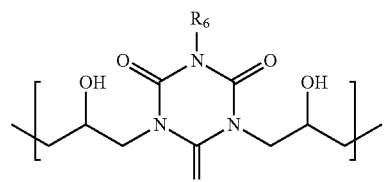

(4a)

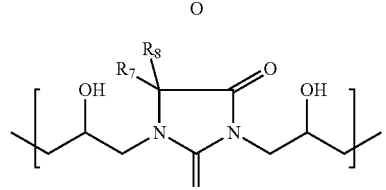

(4b)

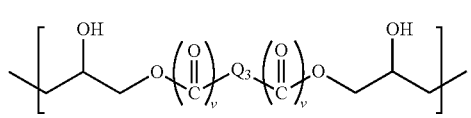

(4c)

(wherein $R_6$ is a hydrogen atom, a $C_{1-6}$ alkyl group or allyl group, $R_7$ and $R_8$ are each independently a hydrogen atom or a $C_{1-6}$ alkyl group, $Q_3$ is a $C_{1-13}$ hydrocarbon group optionally having a substituent, or an aromatic ring optionally having a substituent, and two vs are each independently 0 or 1).

4. The resist underlayer film-forming composition for lithography according to claim 2, wherein the structural unit of Formula (5) is a structural unit of Formula (5a), (5b), (5c), or (5d) below

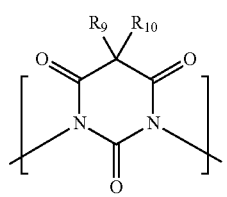

(5a)

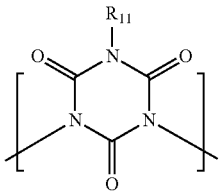

(5b)

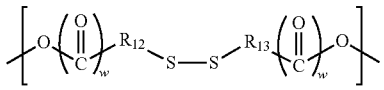

(5c)

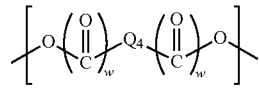

(5d)

(wherein $R_9$ and $R_{10}$ are each independently a hydrogen atom, a $C_{1-6}$ alkyl group, or an aromatic ring, $R_{11}$ is a $C_{1-6}$ alkyl group or allyl group, $R_{12}$ and $R_{13}$ are each independently a $C_{1-3}$ alkylene group, $Q_4$ is a $C_{1-13}$ hydrocarbon group optionally having a substituent, or an aromatic ring optionally having a substituent, and two ws are each independently 0 or 1).

5. The resist underlayer film-forming composition for lithography according to claim 2, wherein the polymer is a polymer of Formula (6) or (7) below

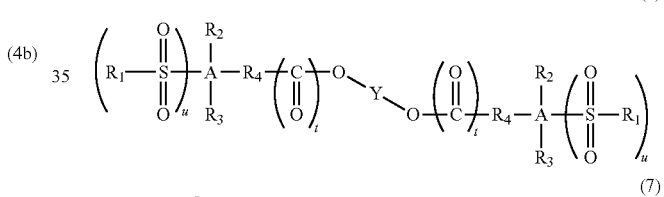

(6)

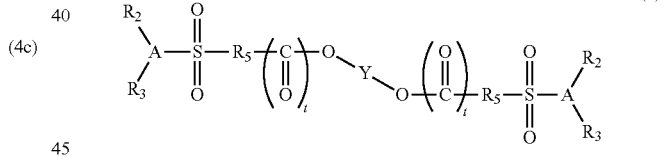

(7)

(wherein $R_1$ is a $C_{1-6}$ alkyl group optionally having a substituent, a phenyl group, a pyridyl group, a halogeno group, or a hydroxy group, $R_2$ is a hydrogen atom, a $C_{1-6}$ alkyl group, a hydroxy group, a halogeno group, or an ester group of —C(=O)O—X wherein X is a $C_{1-6}$ alkyl group optionally having a substituent, $R_3$ is a hydrogen atom, a $C_{1-6}$ alkyl group, a hydroxy group, or a halogeno group, $R_4$ is a direct bond or a divalent $C_{1-8}$ organic group, $R_5$ is a divalent $C_{1-8}$ organic group, A is an aromatic ring or a heteroaromatic ring, t is 0 or 1, u is 1 or 2, and Y is a polymer chain having the structural unit of Formula (4) and the structural unit of Formula (5)).

6. The resist underlayer film-forming composition for lithography according to claim 1, wherein the polymer has a weight average molecular weight of 800 to 100,000.

7. The resist underlayer film-forming composition for lithography according to claim 1, wherein the organic solvent is one or a combination of two or more selected from the group consisting of propylene glycol monomethyl ether, propylene glycol monomethyl ether acetate, 1-ethoxy-2-propanol, ethyl lactate, butyl lactate, and cyclohexanone.

8. The resist underlayer film-forming composition for lithography according to claim 1, further comprising an acid generator.

9. A method for forming a resist pattern comprising the steps of: applying the resist underlayer film-forming composition for lithography according to claim 1 to a semiconductor substrate, followed by baking to forming a resist underlayer film; forming a resist film on the resist underlayer film using a resist solution; exposing, through a photomask, the semiconductor substrate coated with the resist underlayer film and the resist film to radiation selected from the group consisting of a KrF excimer laser, an ArF excimer laser, an extreme ultraviolet light, and an electron beam; and developing the exposed substrate.

* * * * *